(12) United States Patent
Ishizaki et al.

(10) Patent No.: US 10,678,362 B2
(45) Date of Patent: *Jun. 9, 2020

(54) CONDUCTOR SUPPORT MEMBER FOR CONDUCTORS CONNECTING TOUCH AND DISPLAY SUBSTRATES IN A TOUCH DISPLAY DEVICE

(71) Applicant: Japan Display Inc., Tokyo (JP)

(72) Inventors: Koji Ishizaki, Tokyo (JP); Hayato Kurasawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/364,885

(22) Filed: Mar. 26, 2019

(65) Prior Publication Data

US 2019/0220127 A1 Jul. 18, 2019

Related U.S. Application Data

(63) Continuation of application No. 15/850,925, filed on Dec. 21, 2017, now Pat. No. 10,268,300, which is a
(Continued)

(30) Foreign Application Priority Data

Dec. 17, 2012 (JP) .................................. 2012-275145

(51) Int. Cl.
*G06F 3/041* (2006.01)
*H01L 27/12* (2006.01)
(Continued)

(52) U.S. Cl.
CPC ........ *G06F 3/0412* (2013.01); *G02F 1/13338* (2013.01); *G02F 1/13452* (2013.01);
(Continued)

(58) Field of Classification Search
CPC ........ G06F 3/041; G06F 3/0412; G06F 3/044; G06F 2203/04103; G02F 1/13338;
(Continued)

(56) References Cited

U.S. PATENT DOCUMENTS 5,843,251 A 12/1998 Tsukagoshi
5,946,062 A 8/1999 Hasegawa
(Continued)

FOREIGN PATENT DOCUMENTS

JP 03-209427 9/1991
JP 11-149069 6/1999
(Continued)

OTHER PUBLICATIONS

Notice of Rejection issued in connection with Japanese Patent Application No. 2012-275145, dated Mar. 31, 2015 (11 pages).

*Primary Examiner* — Darlene M Ritchie
(74) *Attorney, Agent, or Firm* — K&L Gates LLP

(57) ABSTRACT

According to an aspect, a display device with a touch detection function includes: a touch detection electrode that detects proximity or contact of an object; a drive electrode to which the excitation signal is applied; a first substrate on which the drive elements are provided; a second substrate on which at least one of the touch detection electrode and the drive electrode is provided, the second substrate being bonded to the first substrate to face each other via a sealing member; a conductor that electrically is coupled to at least one of the touch detection electrode and the drive electrode; and a conductor support member that fills a space between the first substrate and the second substrate and on the surface of which the conductor is provided.

6 Claims, 22 Drawing Sheets

Related U.S. Application Data continuation of application No. 15/422,635, filed on Feb. 2, 2017, now Pat. No. 9,904,391, which is a continuation of application No. 14/101,515, filed on Dec. 10, 2013, now Pat. No. 9,606,678.

(51) Int. Cl.

| | | |
|---|---|---|
| *G02F 1/1362* | (2006.01) | |
| *G02F 1/1343* | (2006.01) | |
| *G02F 1/1345* | (2006.01) | |
| *G02F 1/1333* | (2006.01) | |
| *G06F 3/044* | (2006.01) | |
| *G02F 1/1341* | (2006.01) | |
| *G02F 1/1339* | (2006.01) | |

(52) U.S. Cl.
CPC .. *G02F 1/134309* (2013.01); *G02F 1/136286* (2013.01); *G06F 3/044* (2013.01); *G06F 3/0416* (2013.01); *H01L 27/1244* (2013.01); *G02F 1/1339* (2013.01); *G02F 1/1341* (2013.01); *G02F 1/13439* (2013.01); *G02F 2001/133354* (2013.01); *G02F 2001/136295* (2013.01); *G06F 2203/04103* (2013.01); *G06F 2203/04108* (2013.01)

(58) Field of Classification Search
CPC ............. G02F 1/13452; G02F 1/13454; G02F 1/13458; G02F 1/1345; G02F 1/136286; G02F 1/13336; G02F 1/1341; G02F 2001/13456; G02F 2001/133354; G02F 2001/133368; G02F 2001/133388; G02F 2001/133391; G02F 2202/28; H05K 3/32; H05K 3/321; H05K 3/361; H05K 3/323; H05K 1/028; H05K 1/0281; H05K 1/0283; H01L 27/124; H01L 27/1244; H01L 27/1292
See application file for complete search history.

(56) References Cited

U.S. PATENT DOCUMENTS

| | | |
|---|---|---|
| 6,697,139 B1 | 2/2004 | Kawamura et al. |
| 6,946,802 B2 | 9/2005 | Hayashi |
| 7,088,417 B2 | 8/2006 | Kamijima et al. |
| 7,279,641 B2 | 10/2007 | Shikina |
| 7,638,854 B2 | 12/2009 | Tanaka et al. |
| 9,063,361 B2 | 6/2015 | Oohira |
| 2002/0056872 A1 | 5/2002 | Baliga |
| 2004/0238827 A1 | 12/2004 | Takayama |
| 2005/0195527 A1 | 9/2005 | Yamaguchi |
| 2006/0035036 A1 | 2/2006 | Yim |
| 2006/0285054 A1 | 12/2006 | Teramoto |
| 2008/0289859 A1 | 11/2008 | Mikado |
| 2008/0289860 A1 | 11/2008 | Kita |
| 2008/0309865 A1 | 12/2008 | Suita |
| 2009/0045403 A1 | 2/2009 | Yamazaki |
| 2009/0284679 A1 | 11/2009 | Kim |
| 2010/0090995 A1 | 4/2010 | Chung et al. |
| 2010/0170703 A1 | 7/2010 | Iihola |
| 2010/0295800 A1 | 11/2010 | Kuo |
| 2010/0316851 A1 | 12/2010 | Hirai et al. |
| 2011/0141042 A1 | 6/2011 | Kim et al. |
| 2011/0316810 A1 | 12/2011 | Tsujino et al. |
| 2012/0098774 A1 | 4/2012 | Abe |
| 2012/0120616 A1 | 5/2012 | Katsui |
| 2012/0146919 A1 | 6/2012 | Kim |
| 2012/0186856 A1 | 7/2012 | An |
| 2012/0206403 A1 | 8/2012 | Wang et al. |
| 2012/0292105 A1 | 11/2012 | Fujita |
| 2012/0299888 A1 | 11/2012 | Kim |
| 2013/0162656 A1 | 6/2013 | Holman et al. |
| 2014/0078705 A1 | 3/2014 | Jo |
| 2014/0085317 A1 | 3/2014 | Lavery |
| 2014/0092034 A1 | 4/2014 | Franklin |
| 2014/0111953 A1 | 4/2014 | McClure |
| 2014/0347578 A1 | 11/2014 | Yamada et al. |

FOREIGN PATENT DOCUMENTS

| | | |
|---|---|---|
| JP | 2005-236040 | 9/2005 |
| JP | 2008-299161 | 12/2008 |
| JP | 2011-059155 | 3/2011 |
| JP | 2012-242432 | 12/2012 |

CONDUCTOR SUPPORT MEMBER FOR CONDUCTORS CONNECTING TOUCH AND DISPLAY SUBSTRATES IN A TOUCH DISPLAY DEVICE

CROSS REFERENCES TO RELATED APPLICATIONS

The present application is a continuation of U.S. patent application Ser. No. 15/850,925 filed on Dec. 21, 2017, which is a continuation of U.S. patent application Ser. No. 15/422,635 filed on Feb. 2, 2017, which is a continuation of U.S. patent application Ser. No. 14/101,515 filed on Dec. 10, 2013, which claims priority to Japanese Patent Application JP 2012-275145 filed in the Japan Patent Office on Dec. 17, 2012, the entire content of which is hereby incorporated by reference.

BACKGROUND

1. Technical Field

The present disclosure relates to a touch detection device capable of detecting an object approaching from outside, an electronic apparatus with the same, and a method of manufacturing the display device with a touch detection function.

2. Description of the Related Art

Recently, a touch detection device, which is referred to as, so-called a touch panel, capable of detecting a physical body approaching from outside as an object is attracting attention. The touch detection device is combined with a display device, for example, and is used as a device for inputting information by displaying various images and the like for input on the display device.

Examples of the display device combined with the touch detection device include a liquid-crystal display device. The liquid-crystal display device has a pair of translucent substrates such as glass that are bonded via a sealing member and between which a liquid layer is interposed. If electrical coupling is required to exchange signals between one of the substrates and the other one of them, for example, conductive paste can be used in the liquid-crystal display device (e.g., Japanese Patent Application Laid-open Publication No. 2008-299161 (JP-A-2008-299161) (see FIG. 4, FIG. 5, etc.)).

In the technology described in JP-A-2008-299161, the conductive paste is applied to a side portion of the substrates. This type of wiring is useful for reducing the thickness of the liquid-crystal display device or the like. Incidentally, there may occur a gap between the substrates at the outside of the sealing member. Because the gap is small, the conductive paste may spread caused by a capillary phenomenon. As a result, in the technology described in JP-A-2008-299161, when fine wiring is required, adjacent wirings are electrically coupled, and therefore a function of wiring may not be exerted.

For the foregoing reasons, there is a need for surely exerting the function of the wiring for electrically coupling between the both of the substrates at the outer side thereof.

SUMMARY

According to an aspect, a display device with a touch detection function includes: a plurality of drive elements that perform a display operation based on a pixel signal and a display drive signal; a touch detection electrode that detects proximity or contact of an object based on an excitation signal; a drive electrode to which the excitation signal fluctuated at least in level at a predetermined cycle is applied in order to detect the proximity or the contact of the object; a first substrate on which the drive elements are provided; a second substrate on which at least one of the touch detection electrode and the drive electrode is provided, the second substrate being bonded to the first substrate to face each other via a sealing member; a conductor that electrically is coupled to at least one of the touch detection electrode and the drive electrode; and a conductor support member that fills a space between the first substrate and the second substrate at a position of at least one edge face of the second substrate or in a manner protruding in a direction farther away from the sealing member than the position of the edge face, and on the surface of which the conductor is provided.

According to another aspect, a display device with a touch detection function includes: a plurality of drive elements that perform a display operation based on a pixel signal and a display drive signal; a touch detection electrode that detects proximity or contact of an object based on an excitation signal; a first substrate on which the drive elements are provided; a second substrate on which the touch detection electrode is provided, the second substrate being bonded to the first substrate to face each other via a sealing member; and a wiring member that includes a conductor for electrically coupling at least the touch detection electrode and an electrode provided on a surface of the first substrate and a base material for supporting the conductor, and that is provided between the second substrate and the first substrate.

According to another aspect, an electronic apparatus includes the display device with a touch detection function.

According to another aspect, a method is of manufacturing a display device with a touch detection function. The method includes: bonding a first substrate on which a plurality of drive elements are formed and a second substrate on which a touch detection electrode is formed using a sealing member; injecting liquid crystal into between the first substrate and the second substrate and sealing an injection hole; providing a resin layer at least on an edge face where the touch detection electrode of the second substrate is pulled out and a portion of a surface of the first substrate; and providing a conductor electrically coupling to the touch detection electrode on a surface of the resin layer.

According to another aspect, a method is of manufacturing a display device with a touch detection function. The method includes: bonding a first substrate on which a plurality of drive elements are formed and a second substrate on which a touch detection electrode is formed via sealing member that is protruded at least from an edge face where the touch detection electrode of the second substrate is pulled out; injecting liquid crystal into between the first substrate and the second substrate and sealing an injection hole; and providing a conductor for electrically coupling the touch detection electrode of the second substrate and an electrode provided on a surface of the first substrate.

Additional features and advantages are described herein, and will be apparent from the following Detailed Description and the figures.

DETAILED DESCRIPTION

Exemplary embodiments for implementing the present disclosure will be explained in detail below with reference to the accompanying drawings in the following order.

1. First Embodiment
   1-1. Overall Configuration
   1-2. Principle of Detection of Touch Operation
   1-3. Display Unit with Touch Detection Function
   1-4. Operation of Display Device with Touch Detection Function
   1-5. Wiring Coupling Structure for Extracting Touch Detection Signal from Touch Detection Electrode
   1-6. Method of Manufacturing Display Device with Touch Detection Function
2. Second Embodiment
   2-1. Wiring Coupling Structure
   2-2. Method of Manufacturing Display Device with Touch Detection Function
3. Application Examples
4. Aspects of Present Disclosure

1. First Embodiment

1-1. Overall Configuration

Figure 1:
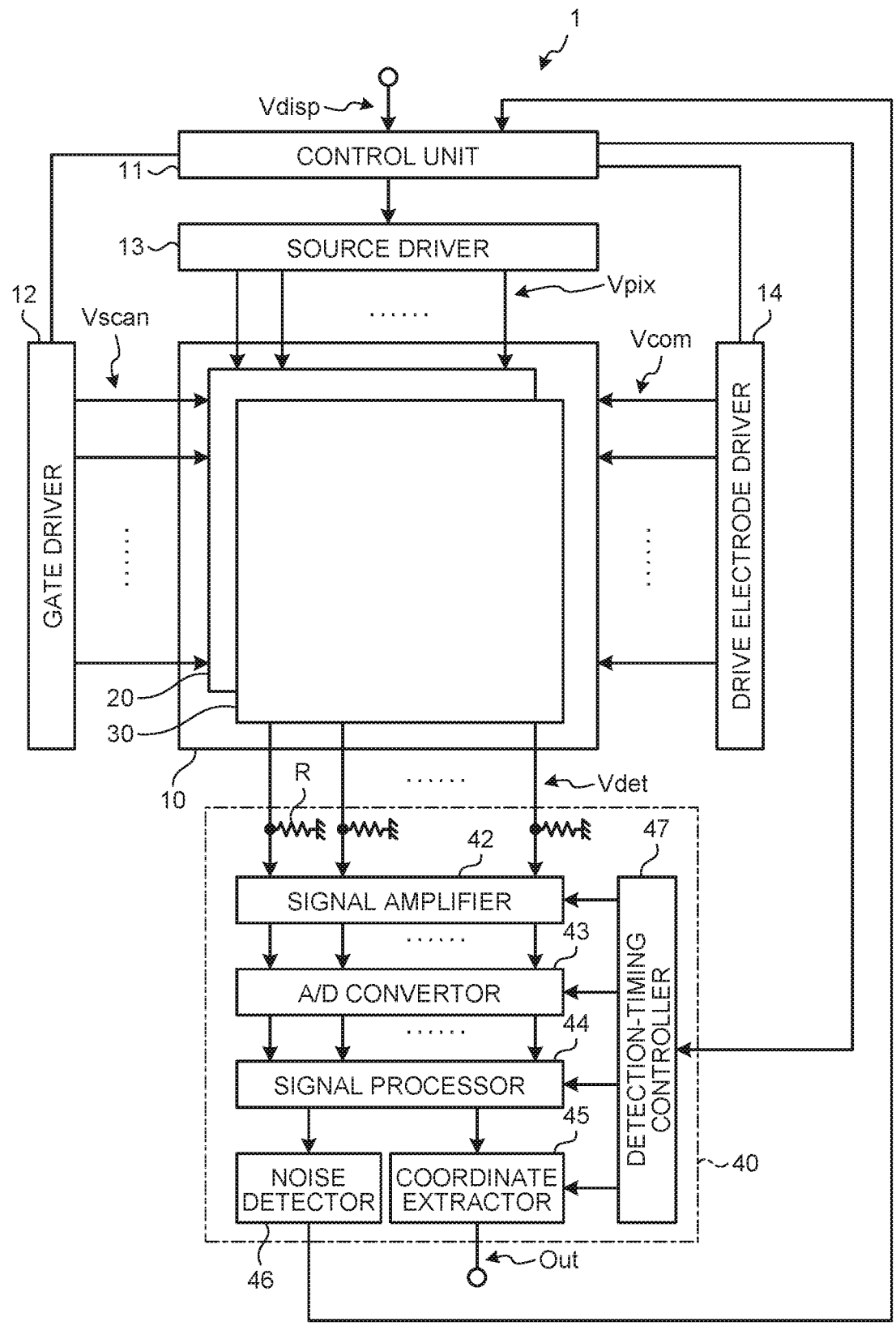
FIG. 1 is a diagram of a configuration example of a display device with a touch detection function according to a first embodiment.

FIG. 1 is a configuration example of a display device with a touch detection function according to a first embodiment. A display device with a touch detection function 1 includes a display unit with a touch detection function 10, a control unit 11, a gate driver 12, a source driver 13, a drive electrode driver 14, and a touch detection unit 40. The display device with a touch detection function 1 is a display device in which the display unit with a touch detection function 10 has a built-in touch detection function. The display unit with a touch detection function 10 is a so-called in-cell type device in which a liquid-crystal display unit 20 using a liquid crystal element as a display element and a capacitive-type touch detecting device 30 are integrated.

The liquid-crystal display unit 20 is a device that sequentially scans and displays horizontal lines one by one according to a scan signal Vscan transmitted from the gate driver 12, as explained later. The control unit 11 is a circuit that transmits a control signal to the gate driver 12, the source driver 13, the drive electrode driver 14, and the touch detection unit 40 based on a video signal Vdisp transmitted from an external device, and thereby provides the control so that these units operate in synchronization with one another.

The gate driver 12 has a function of sequentially selecting one horizontal line, being a target to be driven upon display by the display unit with a touch detection function 10, based on the control signal transmitted from the control unit 11.

The source driver 13 is a circuit that transmits a pixel signal Vpix to each pixel Pix, explained later, of the display unit with a touch detection function 10 based on the control signal transmitted from the control unit 11.

The drive electrode driver 14 is a circuit that supplies a drive signal Vcom to a drive electrode COML, explained later, of the display unit with a touch detection function 10 based on the control signal supplied from the control unit 11.

1-2. Principle of Detection of Touch Operation

Figure 2:
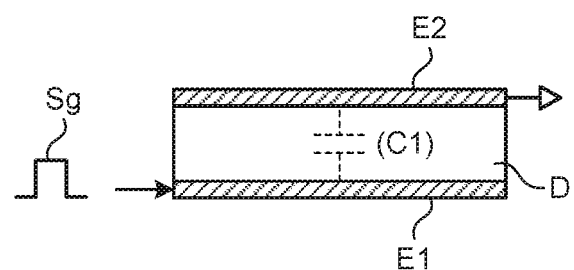
FIG. 2 is an explanatory diagram for explaining a basic principle of a capacitive-type touch detection method and illustrating a state where a finger is not in contact with or in proximity to a touch detection device.
Figure 3:
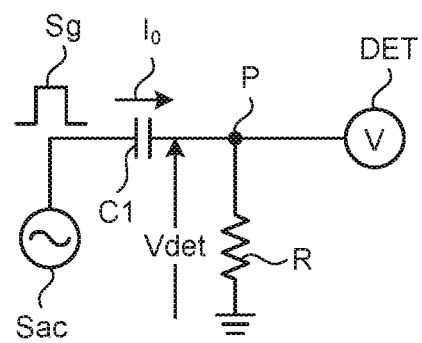
FIG. 3 is an explanatory diagram of an example of an equivalent circuit in the state where the finger is not in contact with or in proximity to the touch detection device illustrated in FIG. 2.
Figure 4:
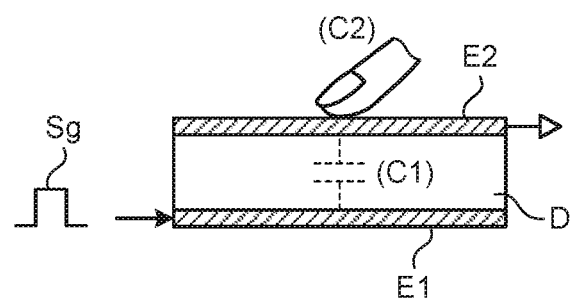
FIG. 4 is an explanatory diagram for explaining a principle of detection of a touch operation and illustrating the state where the finger is in contact with or in proximity to the touch detection device.
Figure 5:
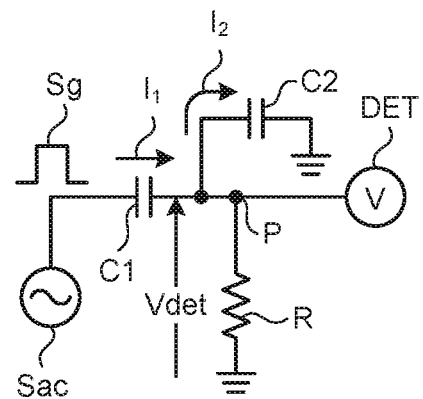
FIG. 5 is an explanatory diagram of an example of the equivalent circuit in the state where the finger is in contact with or in proximity to the touch detection device illustrated in FIG. 3.
Figure 6:
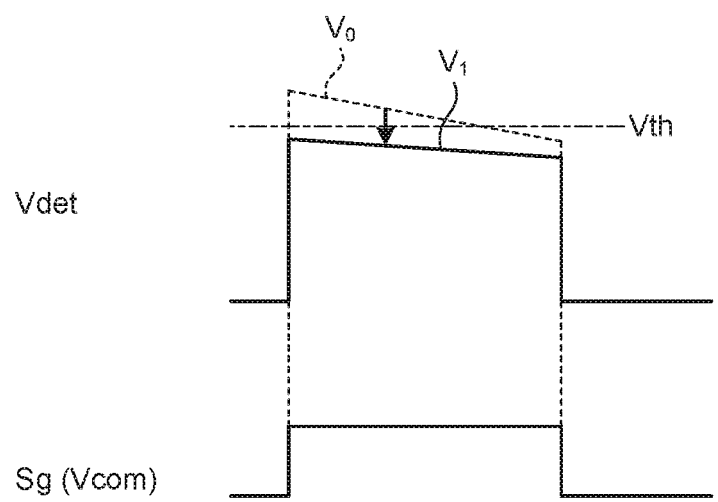
FIG. 6 is a diagram of waveform examples of a touch-detection drive signal and a touch detection signal.

FIG. 2 is an explanatory diagram for explaining a basic principle of a capacitive-type touch detection method and illustrating a state where a finger is not in contact with or in proximity to the touch detection device. FIG. 3 is an explanatory diagram of an example of an equivalent circuit in the state where the finger is not in contact with or in proximity to the touch detection device illustrated in FIG. 2. FIG. 4 is an explanatory diagram for explaining a principle of detection of a touch operation and illustrating the state where the finger is in contact with or in proximity to the touch detection device. FIG. 5 is an explanatory diagram of an example of the equivalent circuit in the state where the finger is in contact with or in proximity to the touch detection device illustrated in FIG. 4. FIG. 6 is a diagram of waveform examples of a touch-detection drive signal and a touch detection signal.

The touch detecting device 30 operates based on the basic principle of capacitive-type touch detection, and outputs a touch detection signal Vdet when detecting approach or contact (hereinafter, also referred to as "touch operation" if necessary) of an object (finger or touch pen, etc.). For example, as illustrated in FIG. 2 and FIG. 4, a capacitive element C1 has a pair of electrodes, a drive electrode E1 and a touch detection electrode E2, which are arranged opposite to each other with a dielectric body D interposed therebetween. As illustrated in FIG. 3 and FIG. 5, the capacitive element C1 is coupled at one end to an alternating-current signal source (drive signal source) Sac, and a point P as the other end of the capacitive element C1 (hereinafter, also referred to as "the other end P") is grounded via a resistor R and is coupled to a voltage detector (touch detector) DET.

When an excitation signal Sg of a predetermined frequency (e.g., about several kHz to several hundreds of kHz) is applied from the alternating-current signal source Sac to the drive electrode E1 (one end of the capacitive element C1), an output waveform (touch detection signal Vdet) appears in the touch detection electrode E2 (the other end P of the capacitive element C1). The excitation signal Sg corresponds to a touch-detection drive signal Vcomt explained later.

In the state where a finger is not contact with (or in proximity to) the touch detection device (non-contact state), as illustrated in FIG. 2 and FIG. 3, a current $I_0$ according to a capacitance of the capacitive element C1 flows in the capacitive element C1 in association with charge and discharge of the capacitive element C1. A potential waveform at the other end P of the capacitive element C1 at this time is like, for example, a waveform $V_0$ as illustrated in FIG. 6. The voltage detector DET illustrated in FIG. 3 detects the waveform $V_0$.

Meanwhile, in the state where the finger is in contact with (or in proximity to) the touch detection device (contact state), as illustrated in FIG. 4, a capacitance formed by the finger acts as if the capacitance as a capacitive element C2 is applied to the capacitive element C1. It is understood from the equivalent circuit illustrated in FIG. 5 that the capacitive element C2 is linearly added to the capacitive element C1. In this state, currents $I_1$ and $I_2$ flow in the capacitive elements C1 and C2 in association with charge and discharge of the capacitive elements C1 and C2. A potential waveform at the other end P of the capacitive element C1 at this time is like, for example, a waveform $V_1$ of FIG. 6. The voltage detector DET detects the waveform $V_1$. At this time, the potential at the point P becomes a divided voltage potential determined by values of the current $I_1$ and $I_2$ passing through the capacitive elements C1 and C2. Therefore, the value of the waveform $V_1$ is lower than that of the waveform $V_0$ in the non-contact state. The voltage detector DET compares the detected voltage with a predetermined threshold voltage Vth, and determines, if the voltage is the threshold voltage Vth or higher, the state as the non-contact state. If the voltage is less than the threshold voltage Vth, then the voltage detector DET determines the state as the contact state. Thus, the touch operation can be detected.

The touch detecting device 30 illustrated in FIG. 1 is configured to sequentially scan drive signal applied blocks one by one to detect a touch operation, according to the touch-detection drive signal Vcomt transmitted from the drive electrode driver 14.

The touch detecting device 30 is also configured to output the touch detection signal Vdet for each drive signal applied block from a plurality of touch detection electrodes TDL, explained later, to be supplied to the touch detection unit 40.

The touch detection unit 40 is a circuit that detects the presence or absence of a touch operation performed on the touch detecting device 30 based on the control signal supplied from the control unit 11 and the touch detection signal Vdet supplied from the touch detecting device 30 of the display unit with a touch detection function 10, and calculates coordinates or the like of the touch operation in a touch detected area when a touch operation is detected. The touch detection unit 40 includes a touch-detection-signal amplifier 42, an analog-to-digital (A/D) convertor 43, a signal processor with a filter 44, a coordinate extractor 45, a noise detector 46, and a detection-timing controller 47.

The touch-detection-signal amplifier 42 amplifies the touch detection signal Vdet transmitted from the touch detecting device 30. The touch-detection-signal amplifier 42 may include a low-pass analog filter that removes a high frequency component (noise component) contained in the touch detection signal Vdet, extracts a touch component, and outputs the touch component. Each of input terminals of the touch-detection-signal amplifier 42 is grounded via the resistor R used to apply a direct current potential (0V). It may be configured to provide, for example, a switch instead of the resistor R and apply a direct current potential (0V) by turning on the switch at a predetermined time.

The A/D convertor 43 is a circuit that samples each analog signal output from the touch-detection-signal amplifier 42 at a timing synchronized with the touch-detection drive signal Vcomt and converts the sampled signal into a digital signal.

The signal processor with a filter 44 includes a digital filter that removes a higher frequency component (noise component) than the frequency at which the touch detection signal Vdet is sampled and extracts a touch component included in the output signal of the A/D convertor 43. The signal processor with a filter 44 is a logic circuit that detects the presence or absence of a touch performed on the touch detecting device 30 based on the output signal of the A/D convertor 43.

The coordinate extractor 45 is a logic circuit that calculates, when the signal processor with a filter 44 detects a touch operation, coordinates of the position thereof in the touch detecting device 30. The detection-timing controller 47 performs the control so that the touch-detection-signal amplifier 42, the A/D convertor 43, the signal processor with a filter 44, and the coordinate extractor 45 operate in synchronization with one another. When noise is included in the output signal of the signal processor with a filter 44, the noise detector 46 outputs a noise notification signal of a touch detection signal to the control unit 11.

1-3. Display Unit with Touch Detection Function

A configuration example of the display unit with a touch detection function 10 will be explained in detail below.

Figure 7:
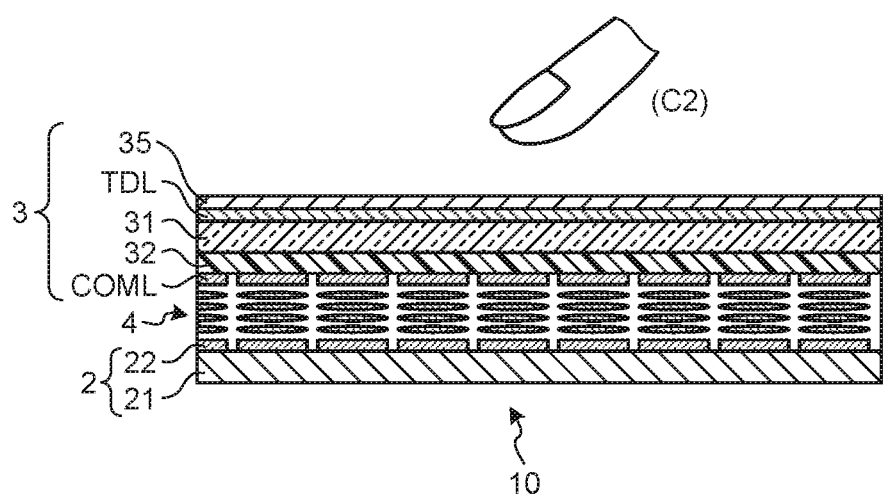
FIG. 7 is a main-portion cross-sectional view of a display unit with a touch detection function.
Figure 8:
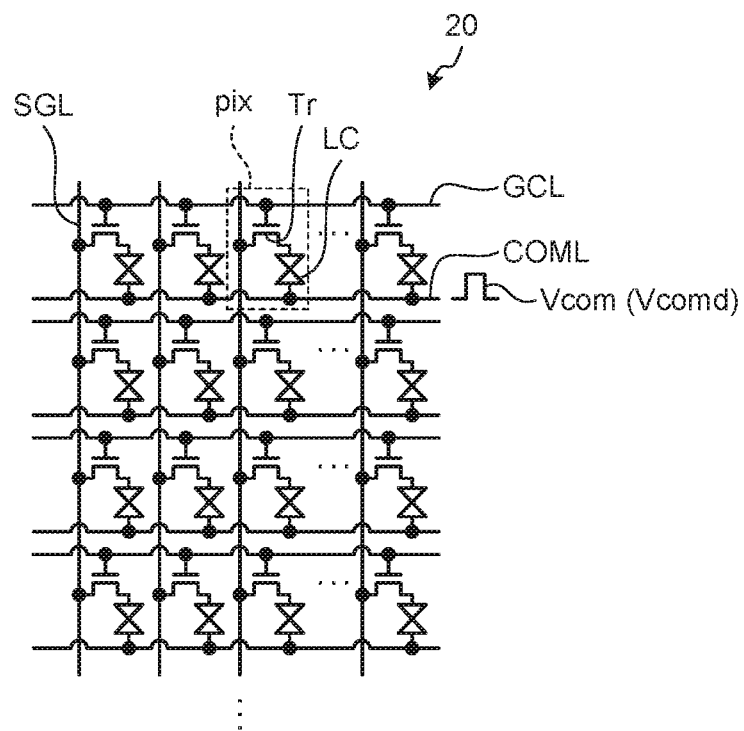
FIG. 8 is a diagram of a circuit example of the display unit with a touch detection function according to the first embodiment.

FIG. 7 is a main-portion cross-sectional view of the display unit with a touch detection function. FIG. 8 is a diagram of a circuit example of the display unit with a touch detection function according to the first embodiment. The display unit with a touch detection function 10 includes a pixel substrate 2 as a first substrate, a counter substrate 3 as a second substrate arranged opposite to the pixel substrate 2, and a liquid crystal layer 4 interposed between the pixel substrate 2 and the counter substrate 3.

The pixel substrate 2 includes a thin film transistor (TFT) substrate 21 as a circuit board and a plurality of pixel electrodes 22 arranged in a matrix on the surface of the TFT substrate 21. Formed on the TFT substrate 21 are, as illustrated in FIG. 8, wirings such as a pixel data line SGL for transmitting a pixel signal Vpix to a TFT element Tr being a drive element of each pixel Pix and to the pixel electrodes 22 and a scan data line GCL for driving each TFT element Tr. The TFT substrate 21 is, for example, a glass substrate. The liquid-crystal display unit 20 illustrated in FIG. 1 has a plurality of pixels Pix arranged in a matrix. Each pixel Pix includes the TFT element Tr and a liquid crystal element LC. The TFT element Tr is, for example, a thin film transistor, which is, in this case, an n-channel metal oxide semiconductor (MOS) TFT. A source of the TFT element Tr is coupled to the pixel data line SGL, a gate thereof is coupled to the scan data line GCL, and a drain thereof is coupled to one end of the liquid crystal element LC. The liquid crystal element LC is coupled at one end to the drain of the TFT element Tr and is coupled at the other end to the drive electrode COML.

The pixel Pix is mutually electrically coupled to the other pixels Pix belonging to the same row of the liquid-crystal display unit 20 through the scan data line GCL. The scan data line GCL is electrically coupled to the gate driver 12 to be supplied with the scan signal Vscan from the gate driver 12. The pixel Pix is mutually electrically coupled to the other pixels Pix belonging to the same column of the liquid-crystal display unit 20 through the pixel data line SGL. The pixel data line SGL is coupled to the source driver 13 to be supplied with the pixel signal Vpix from the source driver 13. Moreover, the pixel Pix is mutually electrically coupled to the other pixels Pix belonging to the same row of the liquid-crystal display unit 20 through the drive electrode COML. The drive electrode COML is electrically coupled to the drive electrode driver 14 to be transmitted with the drive signal Vcom (display drive signal Vcomd and touch-detection drive signal Vcomt) from the drive electrode driver 14. In other words, this example is configured that the pixels Pix belonging to the same row share one line of drive electrode COML.

The gate driver 12 illustrated in FIG. 1 applies the scan signal Vscan to the gates of the TFT elements Tr of the pixels Pix through the scan data line GCL illustrated in FIG. 8 to thereby sequentially select one row (one horizontal line), as a target to be driven upon display, from among the pixels Pix formed in the matrix in the liquid-crystal display unit 20. The source driver 13 illustrated in FIG. 1 transmits the pixel signal Vpix to each of the pixels Pix forming one horizontal line sequentially selected by the gate driver 12 via the pixel data line SGL illustrated in FIG. 8. The pixels Pix are configured so that one horizontal line is displayed according to the transmitted pixel signal Vpix. The drive electrode driver 14 illustrated in FIG. 1 applies the display drive signal Vcomd to drive the drive electrodes COML in each drive signal applied block that includes a predetermined number of drive electrodes COML illustrated in FIG. 7 and FIG. 8.

As explained above, the liquid-crystal display unit 20 drives the gate driver 12 so as to sequentially scan the scan data line GCL, and one horizontal line is thereby sequentially selected. The liquid-crystal display unit 20 is configured so that the source driver 13 transmits the pixel signal Vpix to the pixels Pix belonging to one horizontal line, and horizontal lines are thereby displayed one by one. Upon the display operation, the drive electrode driver 14 applies the display drive signal Vcomd to a drive signal applied block including the drive electrodes COML corresponding to the one horizontal line.

The counter substrate 3 includes a glass substrate 31, a color filter 32 formed on one face of the glass substrate 31, and the drive electrodes COML formed on the surface of the color filter 32 which is on the opposite side to the glass substrate 31. The touch detection electrodes TDL being detection electrodes of the touch detecting device 30 are provided on the other face of the glass substrate 31, and a polarizer 35 is disposed on the surface of the touch detection electrode TDL.

The color filter 32 is such that color filter layers in three colors, for example, red (R), green (G), and blue (B) are periodically arranged and a set of the three colors: R, G, and B is associated with each of the pixels Pix illustrated in FIG. 8.

The drive electrode COML functions as a common drive electrode of the liquid-crystal display unit 20 and also functions as a drive electrode of the touch detecting device 30. In the present embodiment, one drive electrode COML is arranged so as to correspond to one pixel electrode 22 (a row of pixel electrodes 22). The drive electrode COML is configured so that a drive signal Vcom of a square waveform (the display drive signal Vcomd and the touch-detection drive signal Vcomt) is applied from the drive electrode driver 14 to the drive electrodes COML via a contact conductive pillar having conductive properties (not illustrated).

The liquid crystal layer 4 is used to modulate light passing therethrough according to the state of an electric field. A liquid crystal in various modes such as a twisted nematic (TN) mode, a vertical alignment (VA) mode, and an electrically controlled birefringence (ECB) mode can be is used for the liquid crystal layer 4. An alignment film may be provided between the liquid crystal layer 4 and the pixel substrate 2 and between the liquid crystal layer 4 and the counter substrate 3, and an incident-side polarizer may be disposed on the bottom side of the pixel substrate 2.

Figure 9:
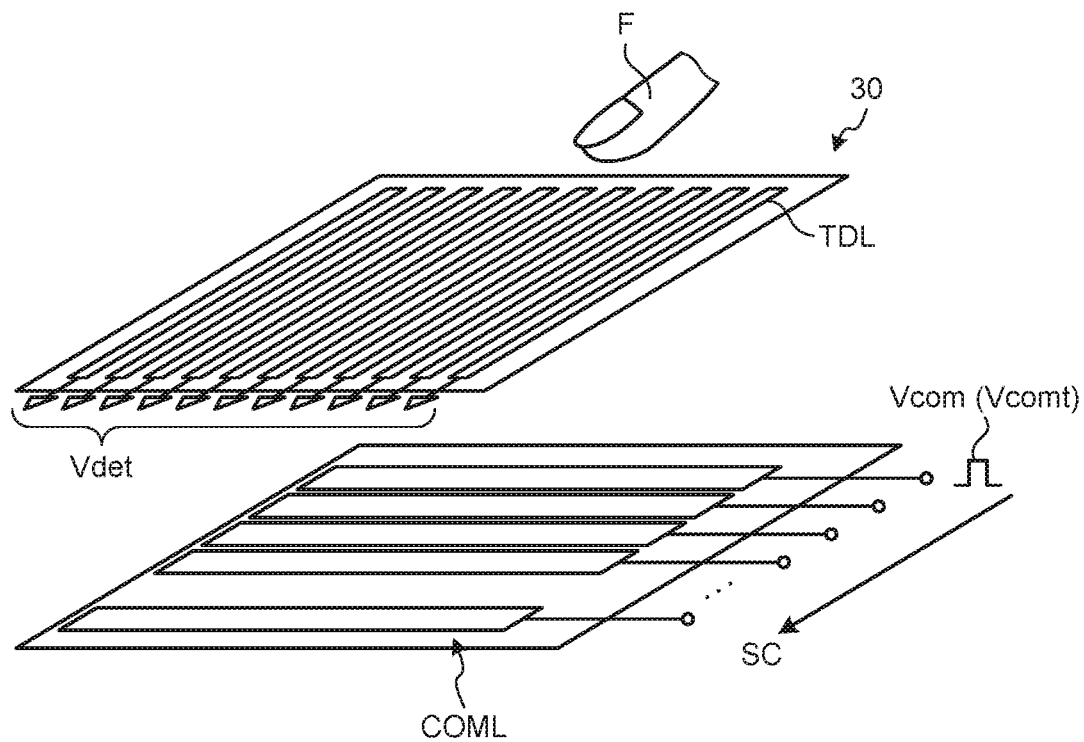
FIG. 9 is a schematic diagram of an example of a touch detecting device.

FIG. 9 is a schematic diagram of an example of a touch detecting device. The touch detecting device 30 includes the drive electrodes COML and the touch detection electrodes TDL provided on the counter substrate 3. The drive electrodes COML are divided into a plurality of stripe-shaped electrode patterns extending along the horizontal direction in the figure. Upon detection of a touch operation, the drive electrode driver 14 sequentially supplies the touch-detection drive signal Vcomt to each of the electrode patterns in a drive signal applied block and performs sequential scan driving toward the direction indicated by arrow SC.

The touch detection electrodes TDL have stripe-shaped electrode patterns extending along a direction intersecting with an extending direction of the electrode patterns of the drive electrodes COML. Each electrode pattern of the touch detection electrodes TDL is coupled to an input of the touch-detection-signal amplifier 42 of the touch detection unit 40. The electrode patterns of the drive electrode COML and the touch detection electrode TDL which intersect one another forms a capacitance at the intersection.

By thus doing, the touch detecting device 30 is configured to drive the drive electrode driver 14 so as to perform sequential scanning on drive signal applied blocks when a touch operation is detected, and thereby sequentially select one drive signal applied block. At this time, the touch detecting device 30 outputs the touch detection signal Vdet from the touch detection electrode TDL to thereby enable touch detection on one drive signal applied block. In other words, the drive signal applied block corresponds to the drive electrode E1 and the touch detection electrode TDL corresponds to the touch detection electrode E2 in the detection principle of the touch detection. The touch detecting device 30 detects a touch operation according to the detection principle. As illustrated in FIG. 9, the mutually intersecting electrode patterns are obtained by forming capacitive-type touch sensors into a matrix. Therefore, by scanning over an entire touch detection surface of the touch detecting device 30, it is possible to detect a position where an object (finger F in the example of FIG. 9) approaches or contacts the touch detection surface.

The liquid crystal element LC corresponds to a specific example of "display element" according to the present disclosure. The gate driver 12 and the drive electrode driver 14 correspond to a specific example of "scan drive unit" according to the present disclosure. The drive electrode COML corresponds to a specific example of "common drive electrode" according to the present disclosure.

1-4. Operation of Display Device with Touch Detection Function

An operation of the display device with a touch detection function 1 will be explained below.

The drive electrode COML functions as a common drive electrode of the liquid-crystal display unit 20 and also functions as a drive electrode of the touch detecting device 30. Because of this, the drive signals Vcom may possibly affect each other. Therefore a display operation period being a period for performing a display operation and a touch-operation detection period being a period for detecting a touch operation are separated from each other, and the drive signal Vcom is applied to the drive electrode COML in each of the periods. The drive electrode driver 14 applies the drive signal Vcom as a display drive signal to the drive electrode COML in the display operation period. The drive electrode driver 14 applies the drive signal Vcom as a touch-detection drive signal to the drive electrode COML in the touch-operation detection period. In the following explanation, the drive signal Vcom as the display drive signal is described as the display drive signal Vcomd, and the drive signal Vcom as the touch-detection drive signal is described as the touch-detection drive signal Vcomt.

The control unit 11 transmits a control signal to the gate driver 12, the source driver 13, the drive electrode driver 14, and the touch detection unit 40 based on the video signal Vdisp transmitted from an external device, and controls these units so as to operate in synchronization with one another. The gate driver 12 transmits the scan signal Vscan to the liquid-crystal display unit 20 in the display operation period, and sequentially selects one horizontal line as a target to be driven upon display. The source driver 13 supplies the pixel signal Vpix to the pixels Pix included in one horizontal line selected by the gate driver 12 in the display operation period.

The drive electrode driver 14 applies the display drive signal Vcomd to the drive signal applied block according to the one horizontal line in the display operation period. The drive electrode driver 14 sequentially applies the touch-detection drive signal Vcomt with a frequency higher than a frequency of the display drive signal Vcomd to the drive signal applied block according to the touch detection operation in the touch-detection operation period, and sequentially selects one drive signal applied block. The display unit with a touch detection function 10 performs a display operation in the display operation period based on the signals transmitted from the gate driver 12, the source driver 13, and the drive electrode driver 14. The display unit with a touch detection function 10 detects a touch operation in the touch-detection operation period based on the signal supplied from the drive electrode driver 14 and outputs the touch detection signal Vdet from the touch detection electrode TDL.

The touch-detection-signal amplifier 42 amplifies and outputs the touch detection signal Vdet. The A/D convertor 43 converts the analog signal output from the touch-detection-signal amplifier 42 into a digital signal at a timing synchronized with the touch-detection drive signal Vcomt. The signal processor with a filter 44 detects the presence or absence of a touch performed on the touch detecting device 30 based on the output signal of the A/D convertor 43. When the signal processor with a filter 44 detects a touch operation, the coordinate extractor 45 calculates touch panel coordinates corresponding to a position of the touch operation in the touch detecting device 30.

The detection-timing controller 47 performs the control so that the touch-detection-signal amplifier 42, the A/D convertor 43, the signal processor with a filter 44, and the coordinate extractor 45 operate in synchronization with one another. When noise is included in the output signal of the signal processor with a filter 44, the noise detector 46 outputs a noise notification signal of a touch detection signal to the control unit 11. The control unit 11 controls the detection-timing controller 47 to change the sampling frequency of the touch-detection drive signal Vcomt.

Figure 10:
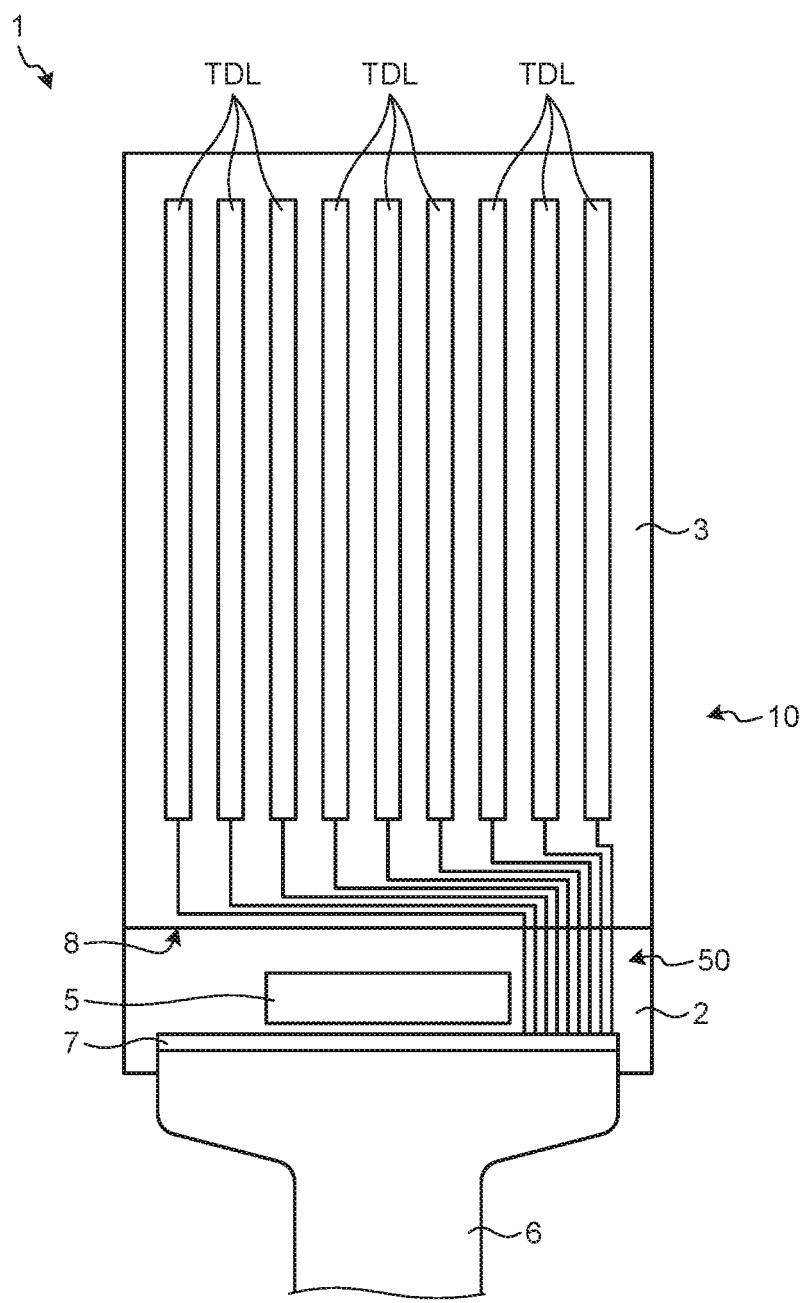
FIG. 10 is a plan view of the display device with a touch detection function according to the first embodiment.
Figure 11:
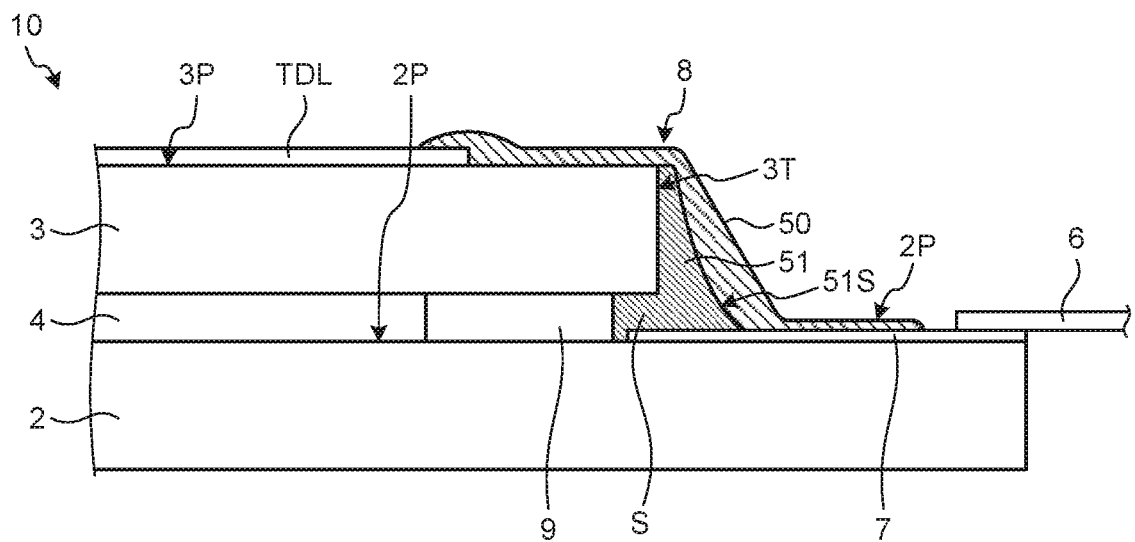
FIG. 11 is a cross-sectional view of a wiring coupling structure of a touch detection electrode according to the first embodiment.
Figure 12:
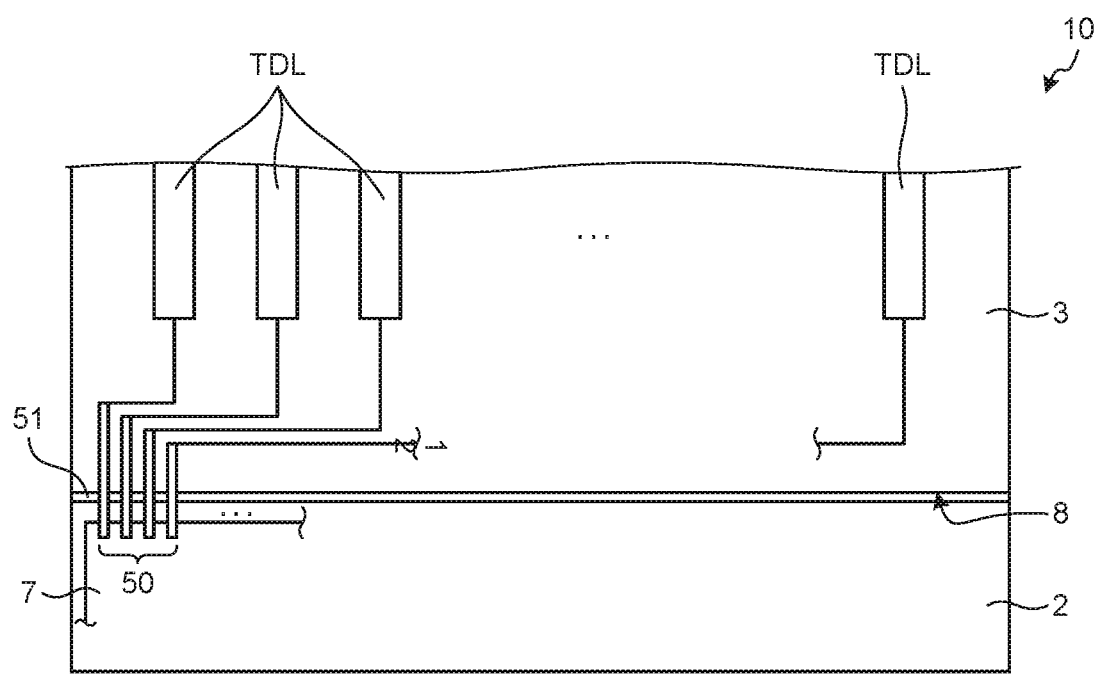
FIG. 12 is a plan view of the wiring coupling structure of the touch detection electrode according to the first embodiment.
Figure 13:
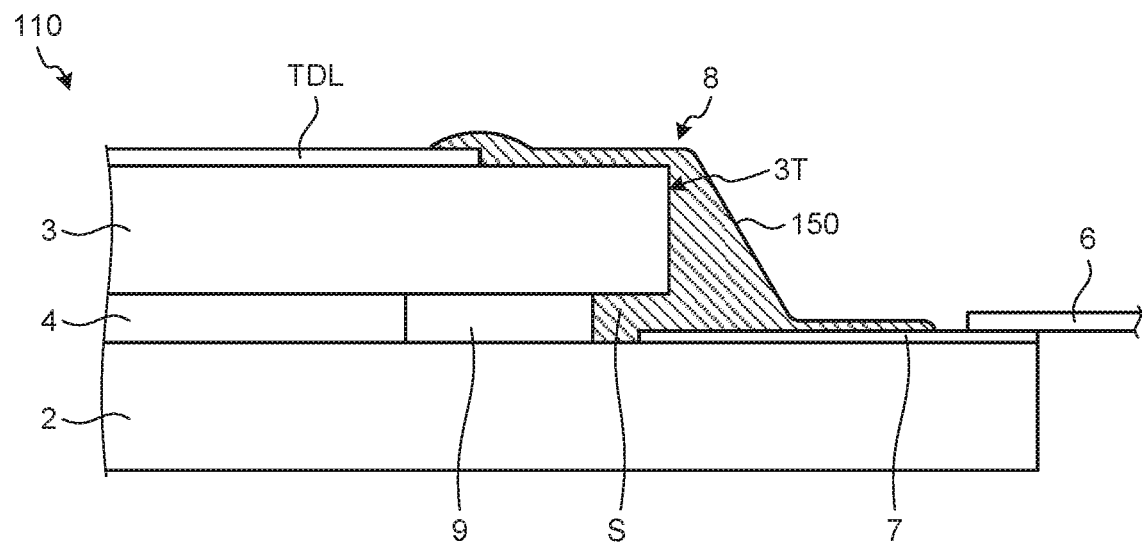
FIG. 13 is a cross-sectional view of a wiring coupling structure of a touch detection electrode according to a comparative example.
Figure 14:
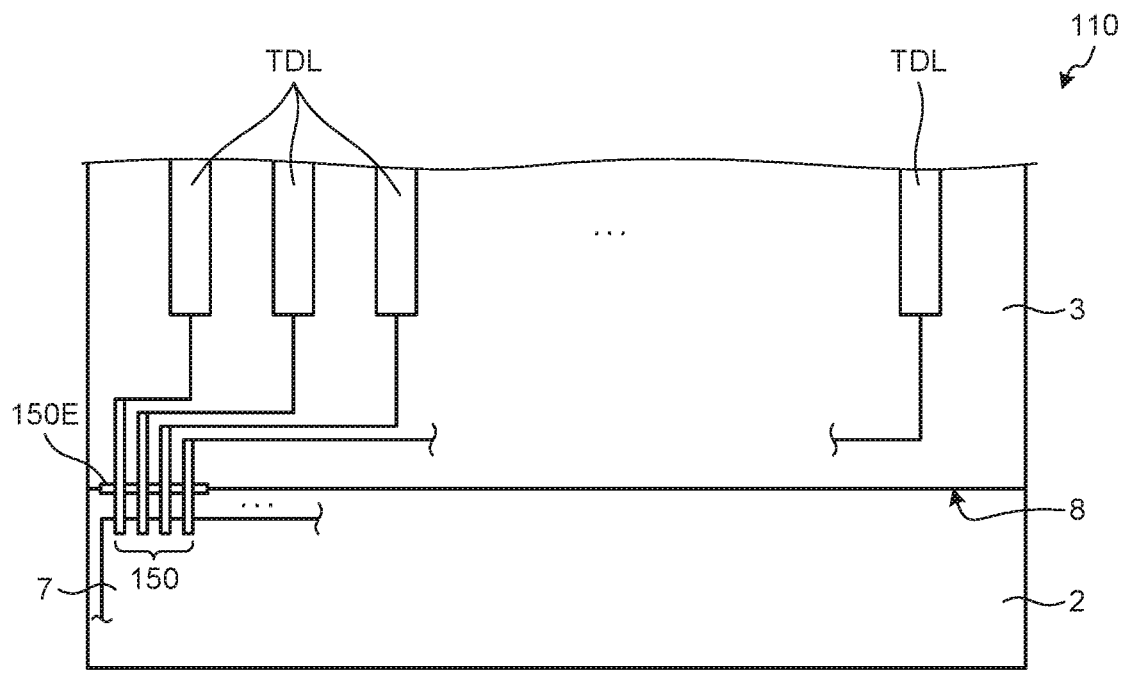
FIG. 14 is a plan view of the wiring coupling structure of the touch detection electrode according to the comparative example.

1-5. Wiring Coupling Structure for Extracting Touch Detection Signal from Touch Detection Electrode FIG. 10 is a plan view of the display device with a touch detection function according to the first embodiment. FIG. 11 is a cross-sectional view of a wiring coupling structure of the touch detection electrode according to the first embodiment. FIG. 12 is a plan view of the wiring coupling structure of the touch detection electrode according to the first embodiment. FIG. 13 is a cross-sectional view of a wiring coupling structure of a touch detection electrode according to a comparative example. FIG. 14 is a plan view of the wiring coupling structure of the touch detection electrode according to the comparative example. A coupling structure (hereinafter, also referred to as "wiring coupling structure") of wiring electrically coupled to the touch detection electrode TDL will be explained below with reference to the figures. The wiring coupling structure is provided to extract the touch detection signal Vdet to the outside from the touch detection electrode TDL of the display unit with a touch detection function 10 provided in the display device with a touch detection function 1.

An electronic component 5 illustrated in FIG. 10 includes at least one of, for example, the gate driver 12, the source driver 13, and the drive electrode driver 14 illustrated in FIG. 1. The electronic component 5 is controlled by the control signal supplied from the control unit 11 illustrated in FIG. 1. In the present embodiment, as illustrated in FIG. 10, conductors 50 each being wiring are electrically coupled to one ends of the touch detection electrodes TDL provided in the display unit with a touch detection function 10, respectively. In the present embodiment, each of the conductors 50 is, for example, conductive paste. The conductors 50 pass through the edge face of the counter substrate 3 on the end side of the touch detection electrodes TDL to be electrically coupled to an electrode 7 provided on the surface of the pixel substrate 2. A flexible printed circuit (FPC) board 6 is also electrically coupled to the electrode 7. With this wiring coupling structure, the touch detection signal Vdet from the touch detection electrode TDL is extracted to the outside of the display unit with a touch detection function 10 via the conductor 50, the electrode 7, and the FPC 6. The extracted touch detection signal Vdet is input to, for example, the touch detection unit 40 illustrated in FIG. 1.

All of the pixel substrate 2, the counter substrate 3, and a sealing member 9 provided therebetween illustrated in FIG. 11 have a certain amount of thickness. The counter substrate 3 is made smaller than the pixel substrate 2 so as not to overlap the electronic component 5 of the pixel substrate 2. Therefore, when the pixel substrate 2 and the counter substrate 3 are faced with each other and are bonded to each other, the thickness of the display unit with a touch detection function 10 sharply changes between the pixel substrate 2 and the edge face of the counter substrate 3 on the end side of the touch detection electrodes TDL. The sharp change in the thickness causes a step 8 to form between the pixel substrate 2 and the edge face of the counter substrate 3 on the end side of the touch detection electrodes TDL.

As illustrated in FIG. 11, outer peripheral portions of the pixel substrate 2 and the counter substrate 3 are bonded to each other by the sealing member 9 to be sealed. However, an outside portion of the sealing member 9 may sometimes enter an inner side of an edge face 3T of the counter substrate 3. Therefore, a space S may be formed between the pixel substrate 2 and the counter substrate 3 at the outside of the sealing member 9. In the related art, the space S may cause the conductor 50 to be disconnected at the position of the step 8.

In the present embodiment, as illustrated in FIG. 11, the display unit with a touch detection function 10 has a conductor support member 51 between at least one edge face 3T of the counter substrate 3 and the pixel substrate 2. The conductor support member 51 fills the space S between the pixel substrate 2 and the counter substrate 3 at a position of at least one edge face 3T of the counter substrate 3 or in a protruding manner in a direction farther away from the sealing member 9 than the position of the edge face 3T. The conductors 50 is provided on the surface of the conductor support member 51. In the example illustrated in FIG. 11, the conductor support member 51 is a resin layer that covers a portion at least from the edge face 3T to part of a surface 2P of the pixel substrate 2 and of which size, i.e. thickness, in a direction perpendicular to the surface 2P of the pixel substrate 2 or to a surface 3P of the counter substrate 3 becomes thinner with the separation of the conductor support member 51 from the edge face 3T. Various resins such as thermosetting resin and ultraviolet (UV) cured resin can be used as the resin layer. Particularly, a solventless type resin of which volume contraction is small upon drying or curing is preferred as the resin layer. An application width of the pixel substrate 2 (width from the step 8 to a resin edge) is preferably set to the thickness of the step 8 or more. To form the conductor support member 51, the resin may be applied a plurality of times.

In the present embodiment, the conductor support member 51 covers the surface of the electrode 7 as a surface of the pixel substrate 2. As illustrated in FIG. 7, the pixel substrate 2 has the pixel electrodes 22 formed on the surface of the TFT substrate 21 made of glass or so. However, the surface of the pixel substrate 2 includes, in addition to the surface of the TFT substrate 21 itself, electrodes such as the pixel electrodes 22 formed on the surface of the TFT substrate 21, wiring, protective films, and the like.

The conductor support member 51 protrudes in the direction farther away from the sealing member 9 than the position of the edge face 3T, and its thickness becomes thinner with the separation thereof from the edge face 3T of the counter substrate 3. Therefore, the conductor support member 51 has a slope 51S formed between the edge face of the counter substrate 3 and the surface 2P of the pixel substrate 2. The slope 51S is formed to prevent the sharp change in the thickness of the display unit with a touch detection function 10 at the position of the step 8. Moreover, the conductor support member 51 is provided between the pixel substrate 2 and the counter substrate 3 to fill the space S. The wiring coupling structure according to the present embodiment has the conductors 50 formed on the surface (slope 51S) of the conductor support member 51. The wiring coupling structure according to the present embodiment electrically couples the electrode 7 of the pixel substrate 2 and the touch detection electrodes TDL of the counter substrate 3 using the conductors 50.

A display unit with a touch detection function 110 illustrated in FIG. 13 has a wiring coupling structure according to a comparative example. The wiring coupling structure according to the comparative example has a space S between the counter substrate 3 and the pixel substrate 2 at the position of the step 8. A conductor 150 is conductive paste, and therefore, in the wiring coupling structure according to the comparative example, the conductor 150 enters the space S as illustrated in FIG. 13. Because the space S is small in size, the conductor 150 having entered the space S is spread by its surface tension as illustrated in FIG. 14. A spread portion 150E of the conductive paste electrically couples adjacent conductors 150 to each other, and this prevents ensuring insulation between the adjacent conductors 150.

In the wiring coupling structure according to the present embodiment, the conductor support member 51 fills the space S as illustrated in FIG. 11. Because the conductor 50 is provided on the surface of the conductor support member 51, the conductor 50 is substantially prevented from entering the space S. Therefore, as illustrated in FIG. 12, the spread of the conductor 50 in the space S is substantially prevented, which ensures insulation of the adjacent conductors 50. Thus, the conductor 50 can exert the function as wiring for extracting the touch detection signal Vdet from the touch detection electrode TDL.

In the wiring coupling structure according to the comparative example, as illustrated in FIG. 13, the conductor 150 covers the edge face 3T at the position of the step 8, and this leads to a sharp change in the shape of the conductor 150 at a portion covering the edge face 3T, which causes disconnection thereof to easily occur. Because the wiring coupling structure according to the present embodiment has such a structure as above, the conductor support member 51 having the slope 51S suppresses the sharp change in the shape of the conductor 50. Thus, the wiring coupling structure according to the present embodiment can reduce the possibility of disconnection of the conductor 50 at the step 8. Moreover, because the conductor support member 51 is resin, it can be more easily deformed as compared with glass or the like. Therefore, even if a relative position between the counter substrate 3 and the pixel substrate 2 changes, the deformation of the conductor support member 51 allows absorption of the change in the relative position between the counter substrate 3 and the pixel substrate 2. As a result, the deformation of the conductor 50 due to the change in the relative position between the counter substrate 3 and the pixel substrate 2 is suppressed, thus further reducing the possibility of disconnection of the conductor 50.

The wiring coupling structure according to the present embodiment electrically couples the touch detection electrode TDL and the electrode 7 of the pixel substrate 2 using the conductor 50 made of conductive paste. Therefore, electrical resistance can be reduced as compared with a case in which indium tin oxide (ITO) is used for wiring. The resistance of the conductor 50 using the conductive paste decreases more than that of the case where ITO is used for wiring, and a touch detection performance and a detection speed are thereby improved. Particularly, in the in-cell type, because the drive electrode is used as both the touch-detection drive electrode and a common electrode for display, an effect of improving a touch performance obtained by the present embodiment is particularly increased. There is a wiring coupling structure in which the FPC is electrically coupled to the touch detection electrode TDL to extract a touch detection signal Vdet from the touch detection electrode TDL. In this wiring coupling structure, the electronic component 5 and the FPC 6 illustrated in FIG. 10 overlap each other, and the thickness of the display unit with a touch detection function 10 is thereby increased by the thickness of the FPC. The wiring coupling structure according to the present embodiment does not require the FPC to be overlapped with the electronic component 5, and the conductors 50 can be arranged so as to avoid the electronic component 5 mounted on the pixel substrate 2. Therefore, an increase in the thickness of the display unit with a touch detection function 10 can be suppressed. In addition, by arranging the conductors 50 around the electronic component 5, interference with both of them can be avoided. As the conductive paste, a paste material including silver particle and resin can be used, for example. A conductive material included in the conductive paste may be copper, carbon, gold, conductive resin, or the like. The thickness of the conductive paste is preferably set to a value so that the conductive paste does not interfere with a member such as a cover glass disposed on an observer side, and further preferably set to the thickness of the polarizer or less. A lower resistance of the conductive paste is preferable. To ensure the function of the touch panel, any material having a surface resistivity of $1\Omega/\square$ ($\Omega$/sq) or less is preferable. It is further preferable for the conductive paste that the surface resistivity from an upper stage to a lower stage of the step 8 is $100\Omega/\square$ ($\Omega$/sq) or less.

In the example of FIG. 11, the conductor support member 51 protrudes in the direction farther away from the sealing member 9 than the position of the edge face 3T; however, the conductor support member 51 may be provided up to the position of the edge face 3T. That is, the conductor support member 51 may be configured to fill the space S between the counter substrate 3 and the pixel substrate 2 up to the position of the edge face 3T. In the counter substrate 3 and the pixel substrate 2 each of which is rectangular in the plan view, the wiring coupling structure according to the present embodiment may be applied to any location other than the electronic component 5 side illustrated in FIG. 10. Therefore, the conductor support member 51 has only to be provided at the position of at least one edge face 3T of the counter substrate 3.

The in-cell type display unit with a touch detection function 10 and the display device with a touch detection function 1 including the same need to extract a detection signal of the touch detection electrode TDL. The wiring coupling structure according to the present embodiment has also an advantage that the increase in the thickness of the display unit with a touch detection function 10 or so can be suppressed by applying this structure to such an in-cell type display unit with a touch detection function 10 or so and extracting the detection signal of the touch detection electrode TDL via the pixel substrate 2 (hereinafter, the same as above).

The present embodiment has explained the example in which the display unit with a touch detection function 10 is the in-cell type; however, the embodiment is not limited thereto. For example, in the present embodiment, the display unit with a touch detection function 10 may be an on-cell type device in which the liquid-crystal display unit 20 and the touch detecting device 30 illustrated in FIG. 1 are different units.

When the display unit with a touch detection function 10 is the on-cell type, the drive electrodes COML are provided on the counter substrate 3 as the second substrate. In this way, in the present embodiment, at least one of the drive electrodes COML and the touch detection electrodes TDL has only to be provided on the counter substrate 3 as the second substrate. The drive electrodes COML may be provided on any location, such as on the color filter side of the counter substrate 3, on the opposite side to the color filter of the counter substrate 3, or on the pixel substrate 2 as the first substrate. Wiring on the step 8 using the conductive paste may be coupled only to the drive electrodes COML, only to the touch detection electrodes TDL, or to both of them.

In the present embodiment, the touch detection electrode TDL and the drive electrode COML are rectangular in the plan view; however, the embodiment is not limited thereto. The touch detection electrode TDL and the drive electrode COML may be formed, for example, in a rhombus (diamond shape) in the plan view. When the display unit with a touch detection function 10 is the on-cell type, the drive electrode COML and the touch detection electrode TDL may intersect with each other via the insulating layer or may be insulated from each other by means of bridge connection. When the display unit with a touch detection function 10 is the in-cell type, a target to be coupled through the step 8 using the conductor 50 has only to be the touch detection electrode TDL. Therefore, in the present embodiment, the in-cell type can simplify a manufacturing process more than that of the on-cell type.

First Modification

Figure 15:
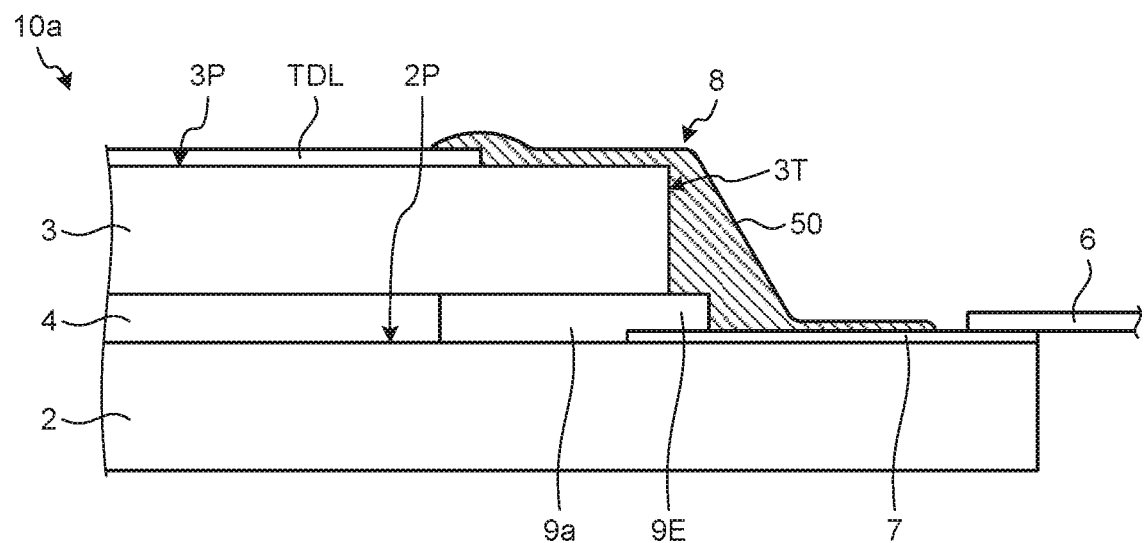
FIG. 15 is a cross-sectional view of a wiring coupling structure of a touch detection electrode according to a first modification of the first embodiment.

FIG. 15 is a cross-sectional view of a wiring coupling structure of a touch detection electrode according to the first modification of the first embodiment. The wiring coupling structure provided in a display unit with a touch detection function 10a according to the present modification has a structure as the conductor support member, as illustrated in FIG. 15, in which a sealing member 9a is provided up to the position of the edge face 3T of the counter substrate 3 or is extended up to a position farther away from the edge face 3T. In the example of FIG. 15, the sealing member 9a extends up to a position farther away from the edge face 3T, and this portion is an extension portion 9E.

With this structure, the space S between the counter substrate 3 and the pixel substrate 2 is filled with the sealing member 9a. The conductors 50 cover the edge face 3T, the sealing member 9a, and the surface of the electrode 7 provided on the surface 2P of the pixel substrate 2, and, as explained above, the space S is filled with the sealing member 9a. Therefore, entering of the conductors 50 being the conductive paste into the space S is substantially prevented. This allows, as explained above, the spread of the conductor 50 in the space S to be substantially prevented, thus ensuring the insulation between the adjacent conductors 50. Accordingly, the conductor 50 can exert the function as wiring for extracting the touch detection signal Vdet from the touch detection electrode TDL.

The extension portion 9E of the sealing member 9a allows a sharp change in the shape of the conductor 50 provided across the step 8 to be suppressed. As a result, the wiring coupling structure according to the present modification enables a reduction in the possibility of the disconnection of the conductor 50 at the step 8. In addition, because the sealing member 9a is resin, it can be more easily deformed as compared with glass or the like. Therefore, even if a relative position between the counter substrate 3 and the pixel substrate 2 changes, the deformation of the sealing member 9a allows absorption of the change in the relative position between the counter substrate 3 and the pixel substrate 2. As a result, the deformation of the conductor 50 is suppressed, thus further reducing the possibility of the disconnection of the conductor 50. In the present modification, the sealing member 9a is extended up to the position away from the edge face 3T of the counter substrate 3; however, the sealing member 9a has only to be provided up to at least the position of the edge face 3T so as to fill the space S. Even if the structure is formed in this way, it is also possible to prevent the spread of the conductor 50 in the space S caused by the capillary phenomenon, thus ensuring the insulation between the adjacent conductors 50.

Second Modification

Figure 16:
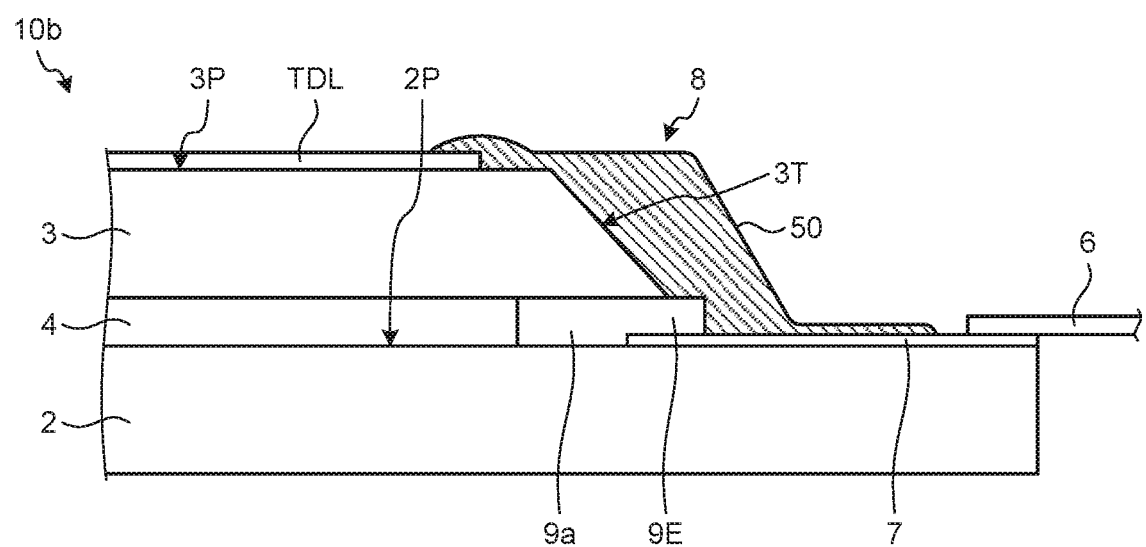
FIG. 16 is a cross-sectional view of a wiring coupling structure of a touch detection electrode according to a second modification of the first embodiment.

FIG. 16 is a cross-sectional view of a wiring coupling structure of a touch detection electrode according to the second modification of the first embodiment. A wiring coupling structure provided in a display unit with a touch detection function 10b according to the present modification is similar to the wiring coupling structure according to the first modification. However, the wiring coupling structure according to the present modification is different from the wiring coupling structure according to the first modification in that the size, i.e. thickness, in a direction perpendicular to the surface 3P of the counter substrate 3 becomes thinner with extension of the edge face 3T of the counter substrate 3 toward the outside of the counter substrate 3. The edge face 3T can be processed to such a shape as above by using a processing method such as oblique scribing, sandblasting, or glass etching.

The wiring coupling structure according to the present modification can obtain the same action and effect as these of the wiring coupling structure according to the first modification. The edge face 3T of the counter substrate 3 is inclined from the surface 3P of the counter substrate 3 toward the sealing member 9a. Therefore, the wiring coupling structure according to the present modification enables to smoothen a pathway, on which the conductor 50 is formed, from the touch detection electrode TDL formed on the surface 3P of the counter substrate 3 to the electrode 7 formed on the surface 2P of the pixel substrate 2. As a result, the wiring coupling structure according to the present modification prevents the sharp change in the shape of the conductor 50 provided across the step 8, thus reducing the possibility of the disconnection of the conductor 50 at the step 8.

Third Modification

Figure 17:
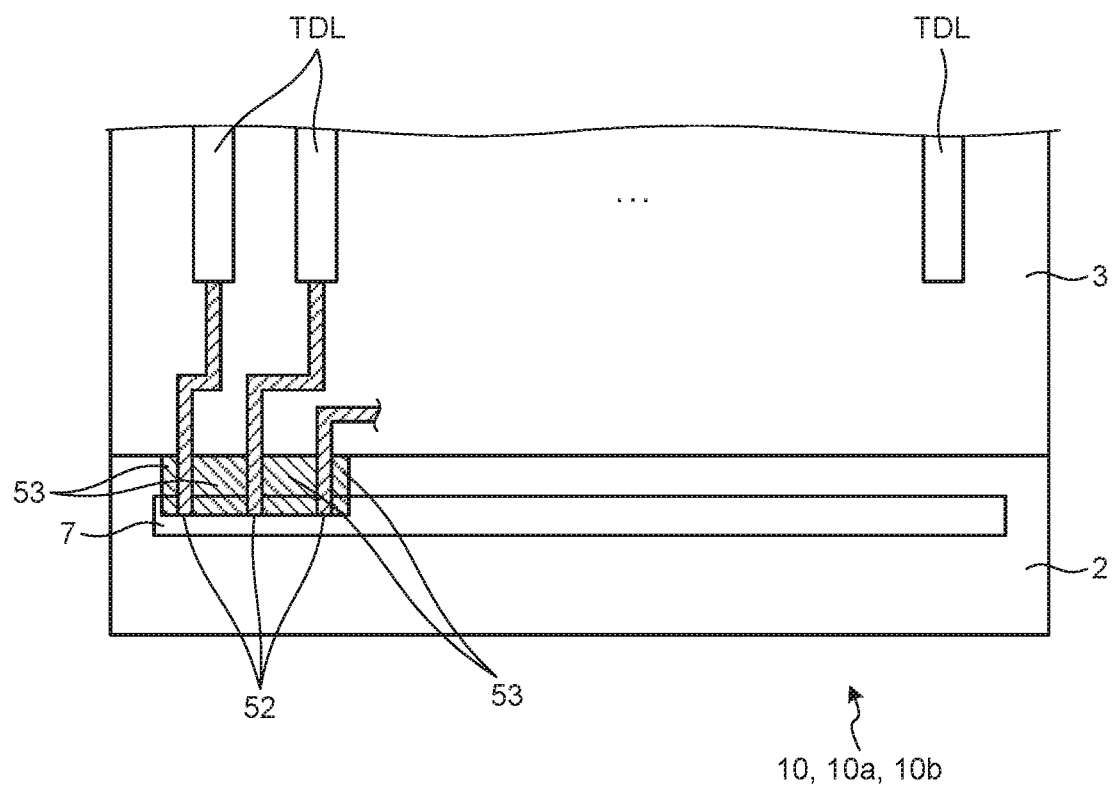
FIG. 17 is a plan view of a wiring coupling structure of a touch detection electrode according to a third modification of the first embodiment.

FIG. 17 is a plan view of a wiring coupling structure of a touch detection electrode according to the third modification of the first embodiment. In the wiring coupling structure according to the present modification, where a structure in which the conductor support member 51 or the sealing member 9 as the conductor support member is provided up to a position away from the edge face 3T of the counter substrate 3, a portion where the conductor 50 is provided has hydrophilic property and a portion where the conductor 50 is not provided has water-repellent property. With this structure, the conductor 50 is surely formed on the portion where the conductive paste as the conductor 50 is to be provided, and because the portion between adjacent conductors 50 is water-repellent, adhesion of the conductive paste thereto can be prevented. As a result, the adjacent conductors 50 can be surely separated from each other, thus ensuring the insulation between the conductors 50.

The wiring coupling structure according to the present modification can be applied to the display units with a touch detection function 10, 10a, and 10b. A portion of hydrophilic property (hydrophilic portion) 52 and a portion of water-repellent property (water-repellent portion) 53 can be formed by, for example, using hydrophobic reaction with active radiation such as ultraviolet rays or patterning a material with a contact angle different from a material of the step 8.

Fourth Modification

Figure 18:
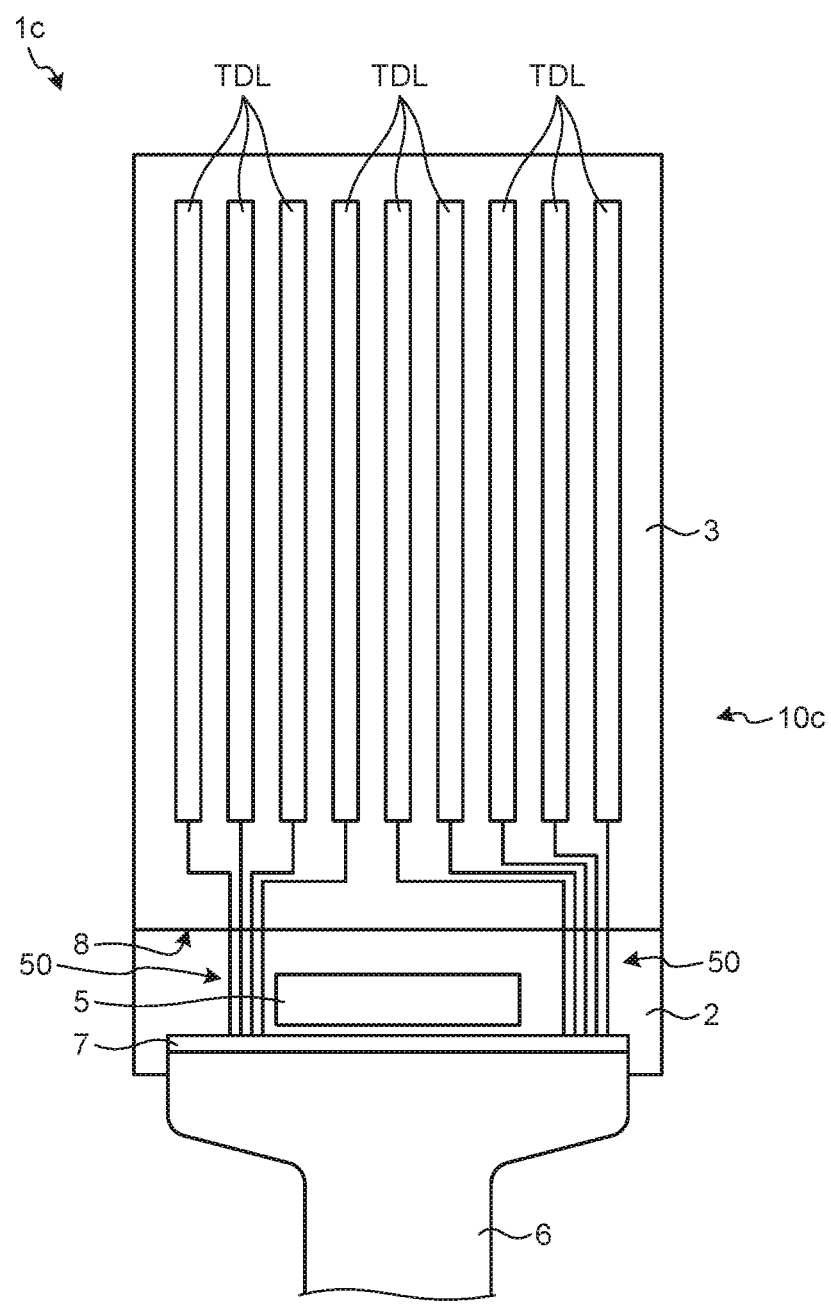
FIG. 18 is a plan view of a display device with a touch detection function according to a fourth modification of the first embodiment.

FIG. 18 is a plan view of a display device with a touch detection function according to the fourth modification of the first embodiment. As explained above, the conductors 50 are arranged around the position of the electronic component 5 mounted on the pixel substrate 2 as illustrated in FIG. 10. The display unit with a touch detection function 10 illustrated in FIG. 10 has the conductors 50 arranged on one side of the electronic component 5. Whereas, as illustrated in FIG. 18, a display unit with a touch detection function 10c according to the present modification has the conductors 50 arranged on both sides of the electronic component 5. With this arrangement, interference between the conductors 50 and the electronic component 5 can be avoided, and concentration of the conductors 50 to one side of the electronic component 5 can be prevented. The wiring coupling structure with the conductors 50 arranged on both sides of the electronic component 5 can also be applied to the display units with a touch detection function 10, 10a, and 10b.

1-6. Method of Manufacturing Display Device with Touch Detection Function

Figure 19:
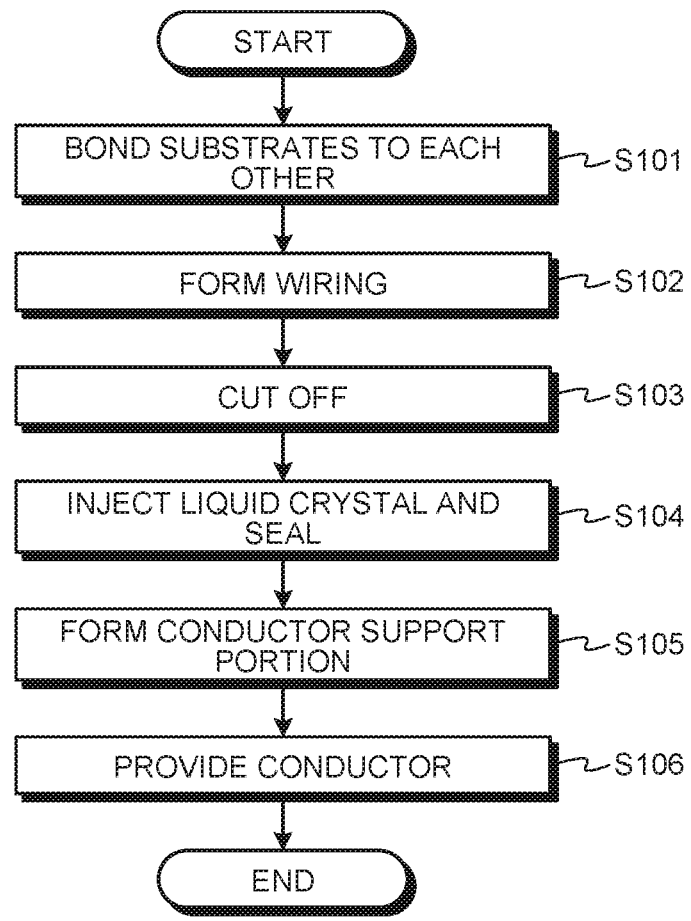
FIG. 19 is a flowchart of a method of manufacturing the display device with a touch detection function according to the first embodiment.

FIG. 19 is a flowchart of a method of manufacturing the display device with a touch detection function according to the first embodiment. The method of manufacturing the display device with a touch detection function is a method of manufacturing the display device with a touch detection function 10 illustrated in FIG. 11 and FIG. 12. First of all, the pixel substrate 2 and the counter substrate 3 are bonded to each other by the sealing member 9 illustrated in FIG. 11 (Step S101). Subsequently, wiring required for the pixel substrate 2 and the counter substrate 3 is formed (Step S102). At this stage, a plurality of display units with a touch detection function 10 are connected to each other as one unit. Therefore, the display units with a touch detection function 10 are cut off (scribed) into separate display units with a touch detection function 10 (Step S103).

Thereafter, the space between the pixel substrate 2 and the counter substrate 3 is injected with a liquid crystal and an injection hole is sealed (Step S104). Thus, the liquid crystal layer 4 illustrated in FIG. 11 is formed. The conductor support member 51 illustrated in FIG. 11 is then formed on the edge face 3T of the counter substrate 3 in a direction along which the touch detection electrode TDL is extended on the electrode 7 side illustrated in FIG. 11 (electronic component 5 side illustrated in FIG. 10) (Step S105). The conductor support member 51 can be formed by applying resin to the edge face 3T using, for example, a dispenser or the like. Subsequently, the conductor 50 is formed on the surface of the conductor support member 51 (Step S106), to electrically couple the touch detection electrode TDL and the electrode 7 of the pixel substrate 2. The conductor 50 can be obtained by forming a pattern of the conductive paste on the surface of the conductor support member 51 using, for example, a dispenser, printing, or ink jet. A solventless type is preferably used as the conductive paste because there is less volume reduction. As is understood from the procedure, the liquid crystal is injected and then the conductor 50 is formed. Therefore, to reduce the influence of temperature on the liquid crystal, it is preferable to use the conductor 50 which is cured at comparatively low temperature.

The display unit with a touch detection function 10 is manufactured in this manner. In addition, by coupling required wiring to the finished display unit with a touch detection function 10 or by attaching a cover or so thereto, the display device with a touch detection function is completed.

Figure 20:
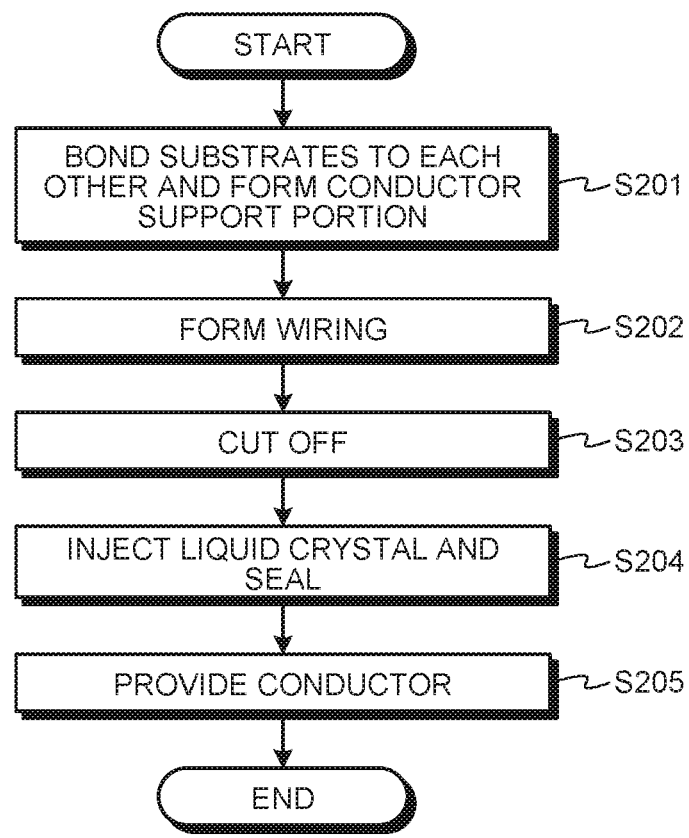
FIG. 20 is a flowchart of another method of manufacturing the display device with a touch detection function according to the first embodiment.

FIG. 20 is a flowchart of another method of manufacturing the display device with a touch detection function according to the first embodiment. The method of manufacturing the display device with a touch detection function is a method of manufacturing the display device with a touch detection function 10a illustrated in FIG. 15. First of all, the pixel substrate 2 and the counter substrate 3 are bonded to each other by the sealing member 9a illustrated in FIG. 15 and the sealing member 9a is extended up to a position away from the edge face 3T of the counter substrate 3, to thereby form the conductor support member (Step S201). Step S202 to Step S204 are the same as Step S102 to Step S104, and explanation thereof is therefore not repeated.

After the liquid crystal is injected and the injection hole is sealed, the conductor 50 is provided on the edge face 3T side of the counter substrate 3 in the direction along which the touch detection electrode TDL is extended on the electrode 7 side illustrated in FIG. 15 (electronic component 5 side illustrated in FIG. 10) (Step S105), to electrically couple the touch detection electrode TDL and the electrode 7 of the pixel substrate 2. When the display unit with a touch detection function 10b illustrated in FIG. 16 is to be manufactured, the edge face 3T of the counter substrate 3 is processed after the cut-off at Step S203. Specifically, the edge face 3T of the counter substrate 3 in the direction along which the touch detection electrode TDL is extended on the electrode 7 side (electronic component 5 side illustrated in FIG. 10) is obliquely processed by scribing or so. The display unit with a touch detection function 10b is manufactured in this manner. In addition, by coupling required wiring to the finished display unit with a touch detection function 10b or by attaching a cover or so thereto, the display device with a touch detection function is completed.

2. Second Embodiment 2-1. Wiring Coupling Structure

Figure 21:
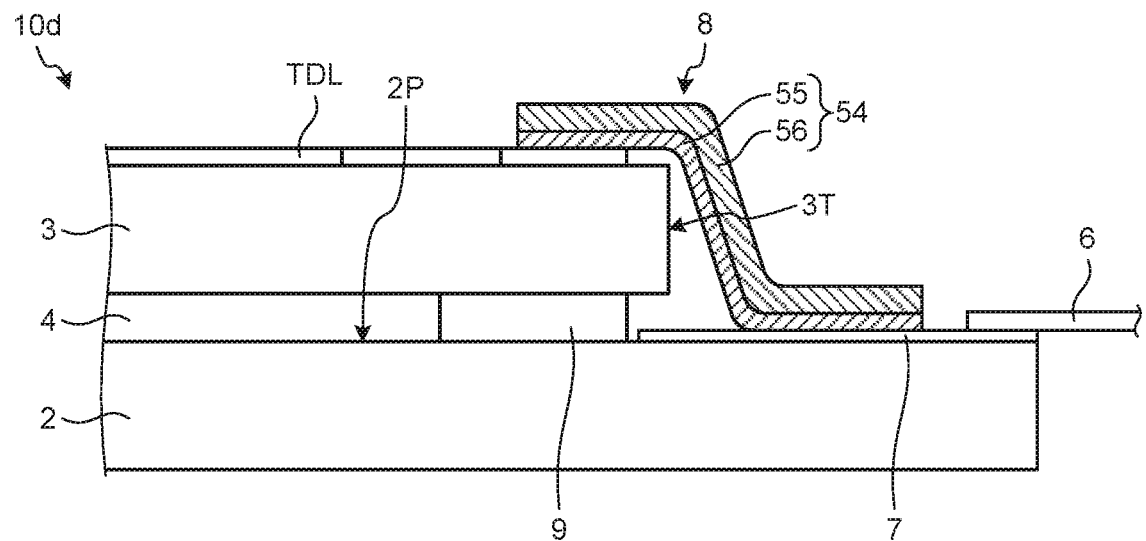
FIG. 21 is a cross-sectional view of a wiring coupling structure of a touch detection electrode according to a second embodiment.
Figure 22:
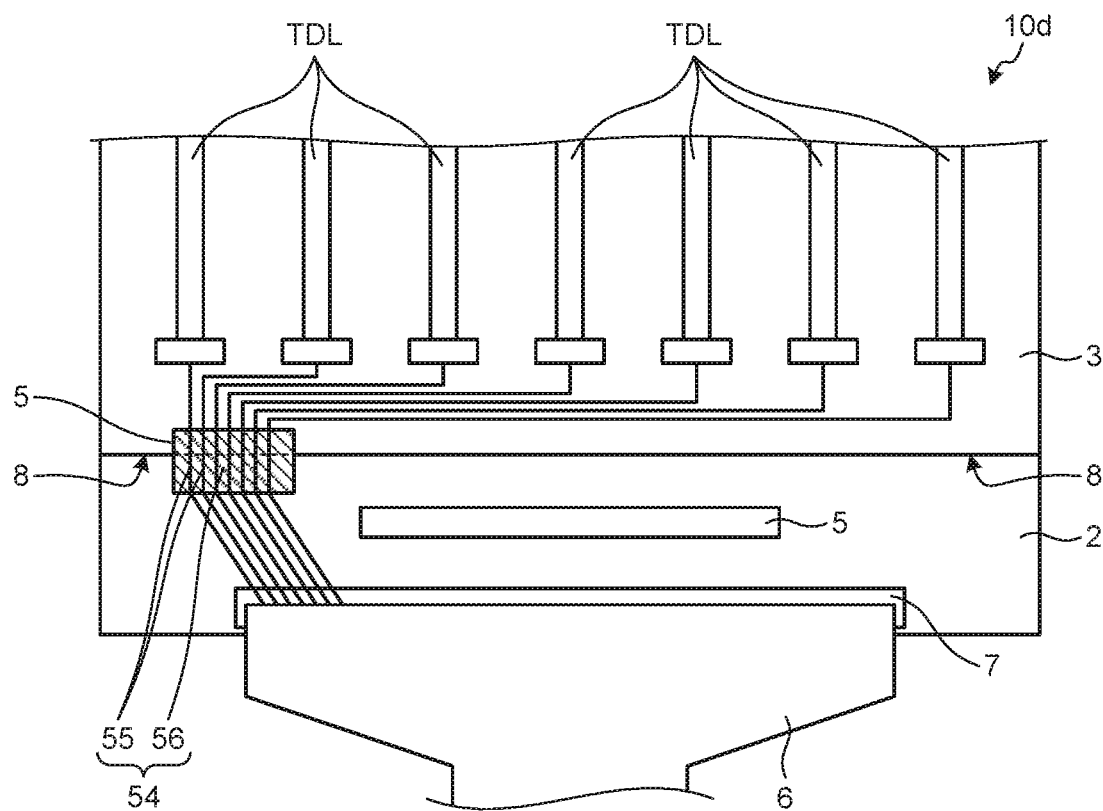
FIG. 22 is a plan view of the wiring coupling structure of the touch detection electrode according to the second embodiment.

FIG. 21 is a cross-sectional view of a wiring coupling structure of a touch detection electrode according to a second embodiment. FIG. 22 is a plan view of the wiring coupling structure of the touch detection electrode according to the second embodiment. A wiring coupling structure provided in a display unit with a touch detection function 10d electrically couples the touch detection electrode TDL and the electrode 7 via a wiring member 54. The wiring member 54 includes a conductor 55 that electrically couples at least the touch detection electrode TDL and the electrode 7 provided on the surface 2P of the pixel substrate 2, and a base material 56 for supporting the conductor 55. The wiring member 54 is provided between the counter substrate 3 and the pixel substrate 2 to electrically couple the touch detection electrode TDL and the electrode 7.

Figure 23:
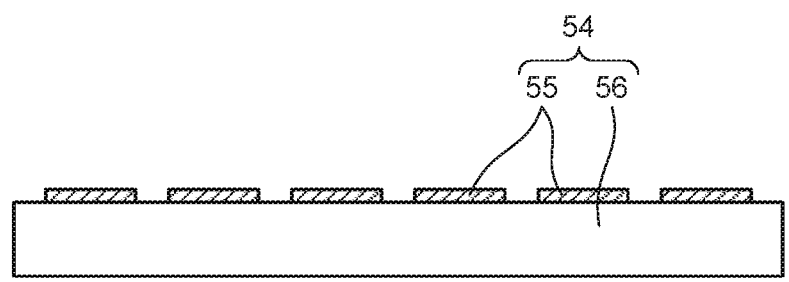
FIG. 23 is a diagram of a wiring member.
Figure 24:
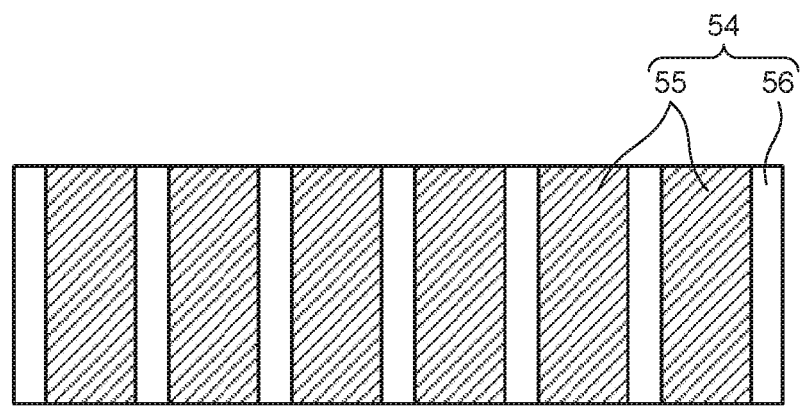
FIG. 24 is a diagram of a wiring member.
Figure 25:
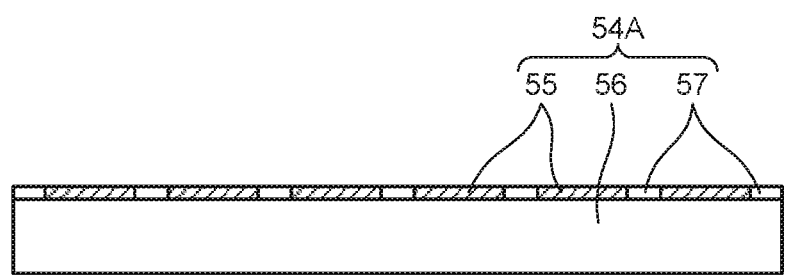
FIG. 25 is a diagram of a wiring member.

FIG. 23 to FIG. 25 are diagrams of the wiring member. The wiring member 54 illustrated in FIG. 23 has a plurality of conductors 55 arranged in a row at predetermined intervals on the base material 56 such as resin. The base material 56 preferably has insulation properties. The base material 56 may be transparent or translucent. Used for the base material 56 are, for example, polyethylene terephthalate (PET), polycarbonate, and polyimide. As illustrated in FIG. 24, the base material 56 is a plate member which is rectangle in the plan view. The base material 56 has flexibility. The conductor 55 is also rectangle in the plan view. In the present embodiment, the conductor 55 is an adhesive layer having conductivity. Examples of the adhesive layer having conductivity include, but not limited to, a conductive tape, conductive resin, and those in which conductive particles are dispersed into the adhesive layer. A wiring member 54A illustrated in FIG. 25 includes a non-conductive adhesive layer 57 arranged between adjacent conductors 55. By providing the non-conductive adhesive layer 57 between the adjacent conductors 55 in this way, the adjacent conductors 55 can be surely insulated from each other.

The wiring members 54 and 54A use the conductive adhesive layer as the conductor 55. Therefore, when the wiring members 54 and 54A are used, the conductor 55 is pressed onto the touch detection electrode TDL or onto wiring pulled out of the touch detection electrode TDL, onto the electrode 7 of the pixel substrate 2 or wiring pulled out of the electrode 7, and the like, and this enables conduction between these components and the conductor 55. As a result, by using the wiring member 54, manufacturing of the display unit with a touch detection function 10*d* and the display device with a touch detection function including the same is facilitated.

As illustrated in FIG. 21 and FIG. 22, the wiring member 54 is provided along a portion of the step 8, so that the wiring pulled out of the touch detection electrode TDL of the counter substrate 3 and the wiring pulled out of the electrode 7 provided on the pixel substrate 2 are electrically coupled to each other by using the conductor 55. In the wiring member 54, although the conductor 55 is opposed to the edge face 3T, the conductor 55 is arranged apart from the edge face 3T. Moreover, as explained above, because the conductors 55 are arranged on the wiring member 54 at predetermined intervals, the conductive paste does not spread over the space between the counter substrate 3 and the pixel substrate 2. In addition, the base material 56 has flexibility, thus reducing the possibility of disconnection of the conductor 55 supported by the base material 56.

Figure 26:
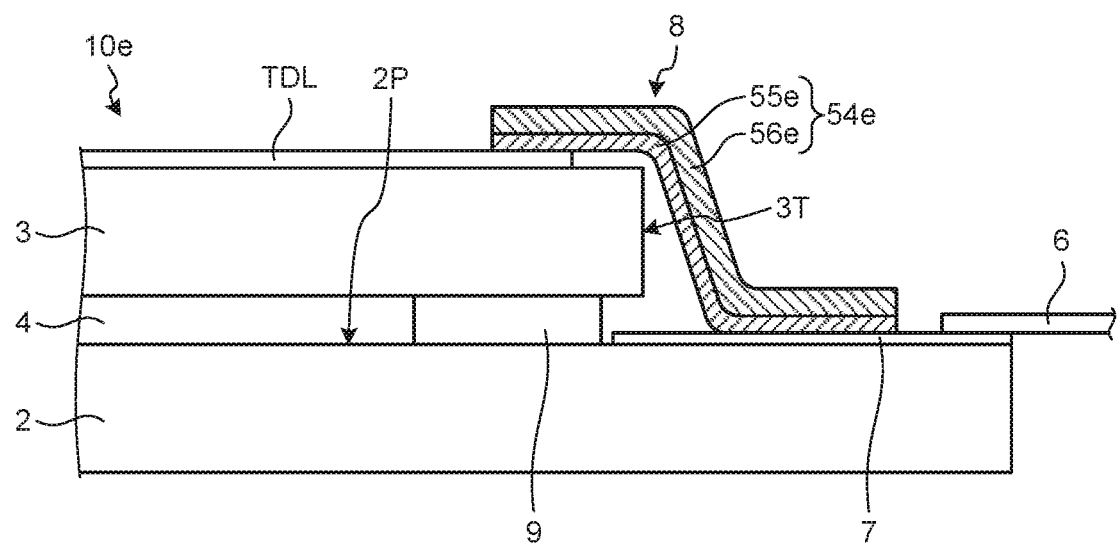
FIG. 26 is a cross-sectional view of a wiring coupling structure of a touch detection electrode according to a modification of the second embodiment.
Figure 27:
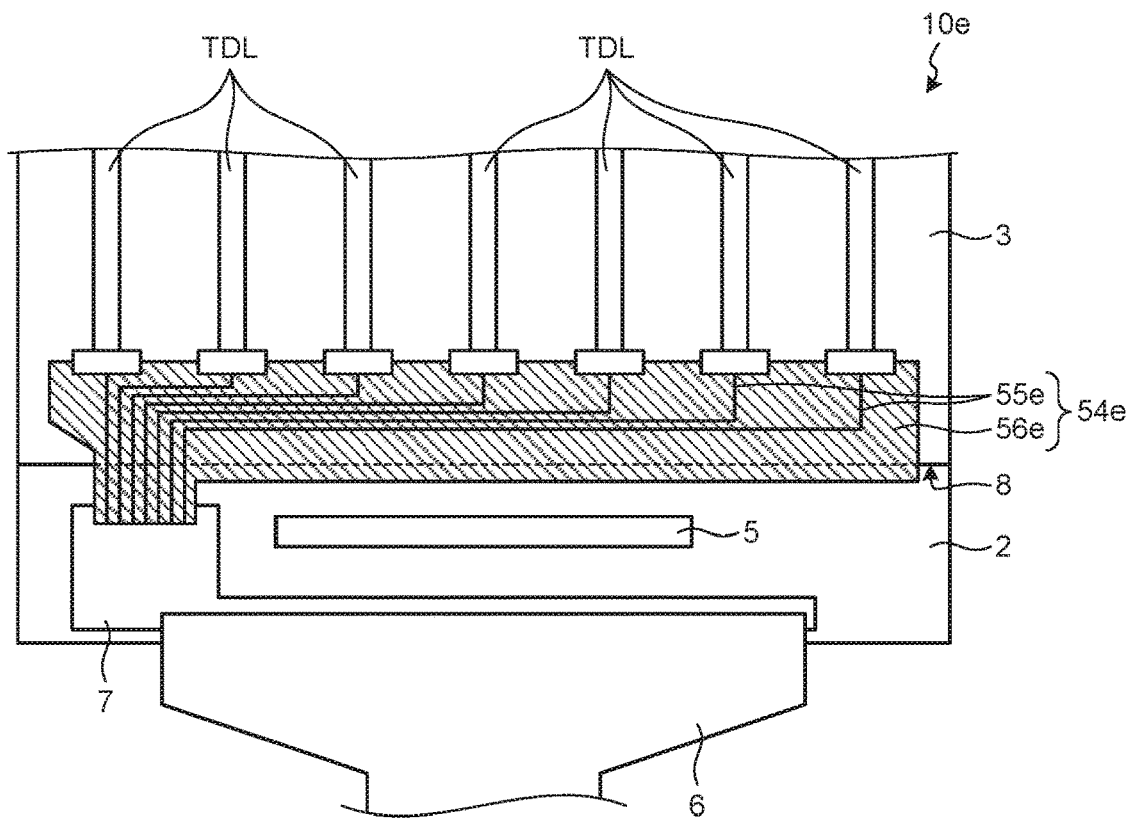
FIG. 27 is a plan view of the wiring coupling structure of the touch detection electrode according to the modification of the second embodiment.

FIG. 26 is a cross-sectional view of a wiring coupling structure of a touch detection electrode according to modification of the second embodiment. FIG. 27 is a plan view of the wiring coupling structure of the touch detection electrode according to the modification of the second embodiment. The wiring coupling structure of the display unit with a touch detection function 10*d* illustrated in FIG. 21 and FIG. 22 electrically couples the wiring pulled out of the touch detection electrode TDL and the wiring pulled out of the electrode 7 provided on the pixel substrate 2 using the conductor 55 of the wiring member 54. On the other hand, a wiring coupling structure of a display unit with a touch detection function 10*e* illustrated in FIG. 26 and FIG. 27 electrically couples the touch detection electrode TDL and the electrode 7 provided on the pixel substrate 2 using a conductor 55*e* of a wiring member 54*e*. In other words, the conductor 55*e* of the wiring member 54*e* is used as both the wiring pulled out of the touch detection electrode TDL and the wiring pulled out of the electrode 7. By thus doing, there is no need to form the wiring pulled out of the touch detection electrode TDL and the wiring pulled out of the electrode 7 on the counter substrate 3 and the pixel substrate 2 respectively. Therefore, the time taken to manufacture the display unit with a touch detection function 10*e* can be reduced. The wiring member 54*e* has a base material 56*e* which is larger in size, by an extended portion of the conductor 55*e*, than that of the wiring member 54 provided in the display unit with a touch detection function 10*d* illustrated in FIG. 21 and FIG. 22.

2-2. Method of Manufacturing Display Device with Touch Detection Function

Figure 28:
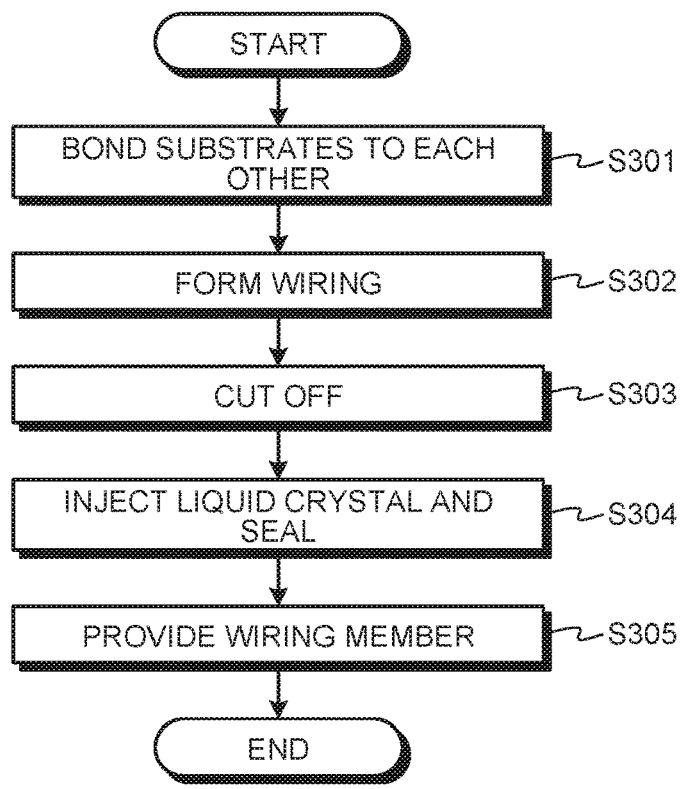
FIG. 28 is a flowchart of a method of manufacturing the display device with a touch detection function according to the second embodiment.

FIG. 28 is a flowchart of a method of manufacturing the display device with a touch detection function according to the second embodiment. Step S301 to Step S304 in the manufacturing method are the same as Step S101 to Step S104 in the above-described manufacturing method (see FIG. 19), and the explanation thereof is therefore not repeated. After the liquid crystal is injected and the injection hole is sealed, the wiring member 54 (54A, 54*e*) is provided on the edge face 3T side of the counter substrate 3 on the electrode 7 side illustrated in FIG. 21 and FIG. 26 in a direction along which the touch detection electrode TDL is extended. The touch detection electrode TDL and the electrode 7 of the pixel substrate 2 are then electrically coupled to each other via the conductor 55 of the wiring member 54. The display units with a touch detection function 10*d* and 10*e* are manufactured in this manner. In addition, by coupling required wiring to the finished display units with a touch detection function 10*d* and 10*e* or by attaching a cover or so thereto, the display device with a touch detection function is completed.

3. Application Examples

As application examples according to the present disclosure, examples of applying the display device with a touch detection function 1 to an electronic apparatus will be explained below.

FIG. 29 to FIG. 40 are diagrams of examples of an electronic apparatus including the display device with a touch detection function according to the present embodiment. The display device with a touch detection function 1 can be applied to electronic apparatuses in all areas such as television devices, digital cameras, notebook personal computers, portable electronic apparatuses such as mobile phones, or video cameras. In other words, the display device with a touch detection function 1 can be applied to electronic apparatuses in all areas that display an externally input video signal or an internally generated video signal as an image or a video.

Application Example 1

Figure 29:
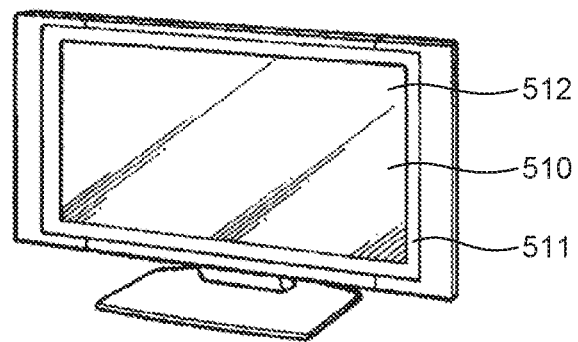
FIG. 29 is a diagram of an example of an electronic apparatus including the display device with a touch detection function according to the embodiment.

The electronic apparatus illustrated in FIG. 29 is a television device to which the display device with a touch detection function 1 is applied. Examples of the television device include, but are not limited to, a video display screen unit 510 including a front panel 511 and a filter glass 512, and the display device with a touch detection function 1 is applied to the video display screen unit 510. In other words, the screen of the television device has a function of detecting a touch operation in addition to a function of displaying an image.

Application Example 2

Figure 30:
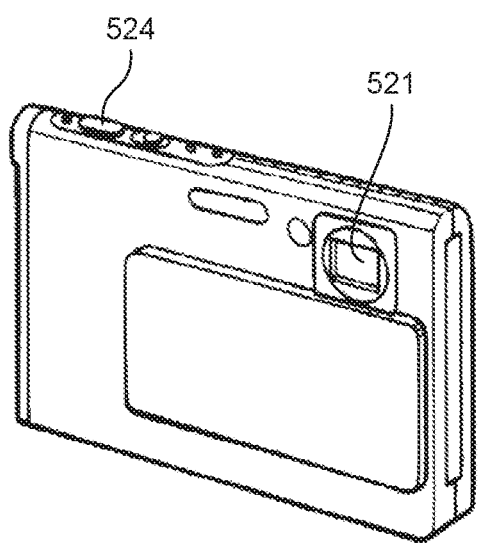
FIG. 30 is a diagram of an example of an electronic apparatus including the display device with a touch detection function according to the embodiment.
Figure 31:
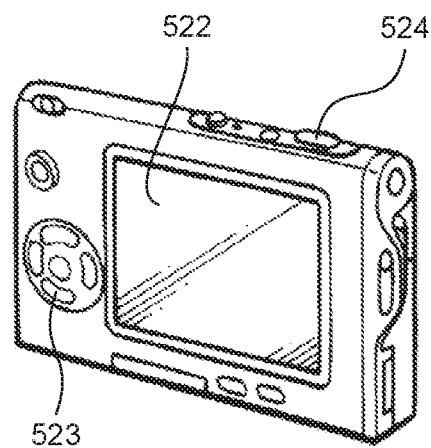
FIG. 31 is a diagram of an example of the electronic apparatus including the display device with a touch detection function according to the embodiment.

The electronic apparatus illustrated in FIG. 30 and FIG. 31 is a digital camera to which the display device with a touch detection function 1 is applied. Examples of the digital camera include, but are not limited to, a light emitting unit 521 for a flash, a display unit 522, a menu switch 523, and a shutter button 524, and the display device with a touch detection function 1 is applied to the display unit 522. Therefore, the display unit 522 of the digital camera has the function of detecting a touch operation in addition to the function of displaying an image.

Application Example 3

Figure 32:
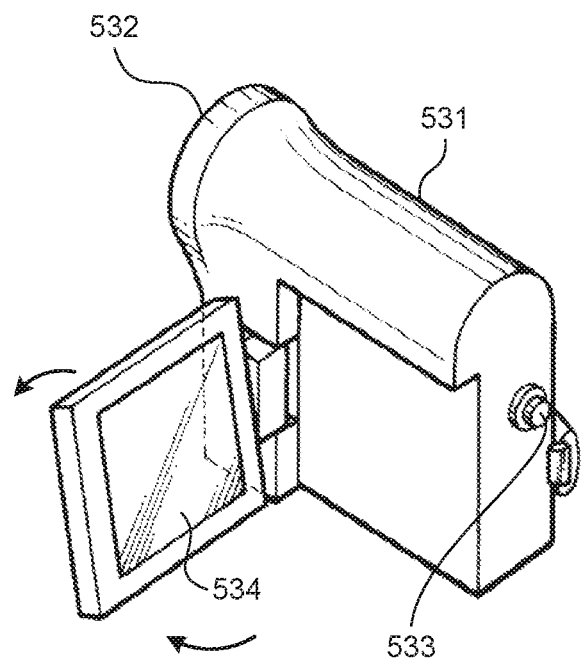
FIG. 32 is a diagram of an example of an electronic apparatus including the display device with a touch detection function according to the embodiment.

The electronic apparatus illustrated in FIG. 32 represents an appearance of a video camera to which the display device with a touch detection function 1 is applied. Examples of the video camera include, but are not limited to, a main body 531, a lens 532 for photographing a subject provided on the front side face of the main body 531, a start/stop switch 533 in photographing, and a display unit 534. The display device with a touch detection function 1 is applied to the display unit 534. Therefore, the display unit 534 of the video camera has the function of detecting a touch operation in addition to the function of displaying an image.

Application Example 4

Figure 33:
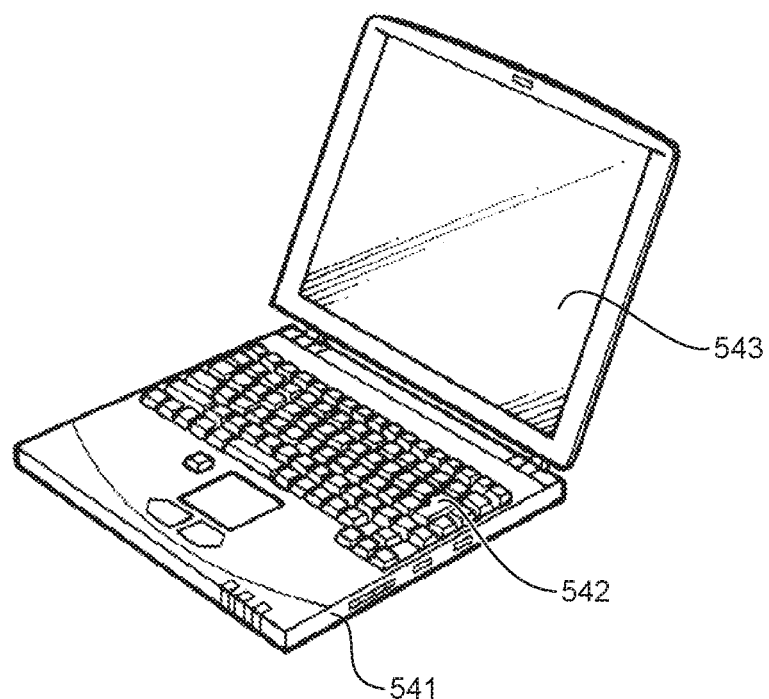
FIG. 33 is a diagram of an example of an electronic apparatus including the display device with a touch detection function according to the embodiment.
Figure 34:
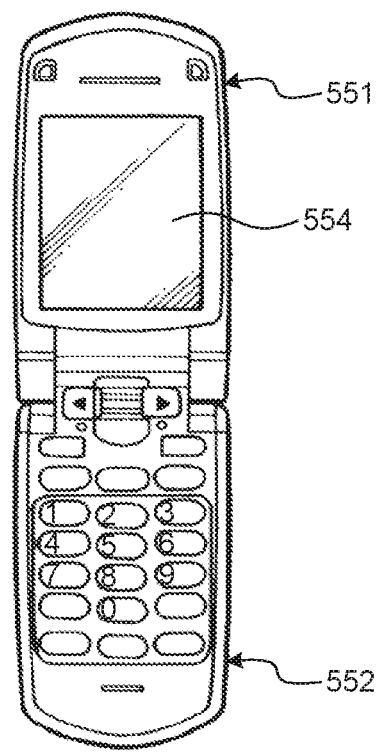
FIG. 34 is a diagram of an example of an electronic apparatus including the display device with a touch detection function according to the embodiment.
Figure 35:
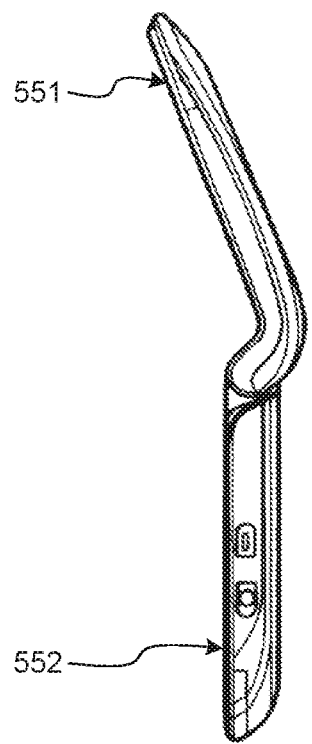
FIG. 35 is a diagram of an example of the electronic apparatus including the display device with a touch detection function according to the embodiment.
Figure 36:
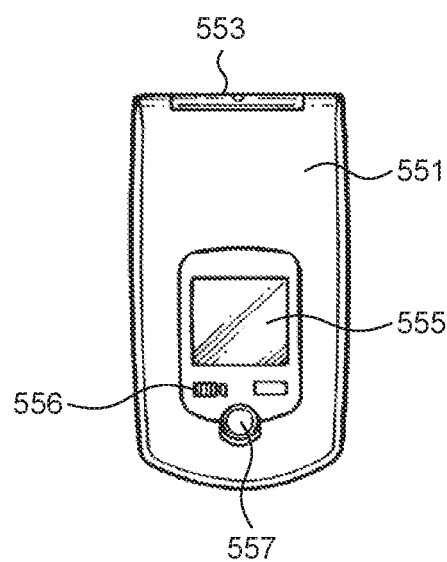
FIG. 36 is a diagram of an example of the electronic apparatus including the display device with a touch detection function according to the embodiment.
Figure 37:
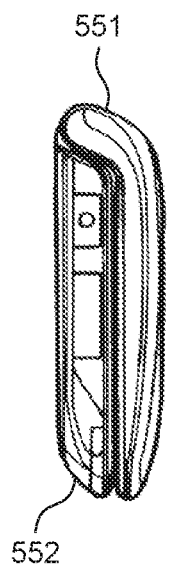
FIG. 37 is a diagram of an example of the electronic apparatus including the display device with a touch detection function according to the embodiment.
Figure 38:
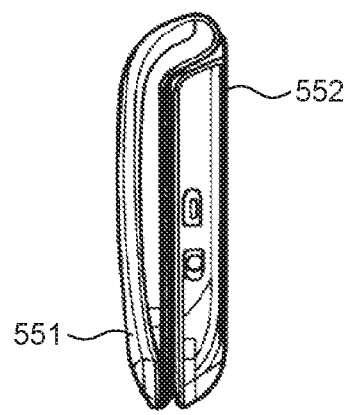
FIG. 38 is a diagram of an example of the electronic apparatus including the display device with a touch detection function according to the embodiment.
Figure 39:
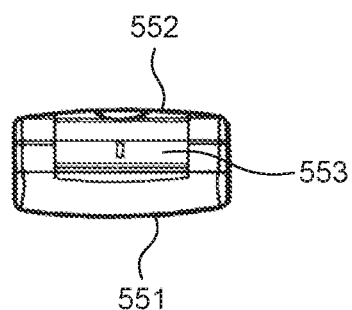
FIG. 39 is a diagram of an example of the electronic apparatus including the display device with a touch detection function according to the embodiment.
Figure 40:
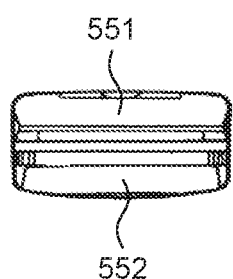
FIG. 40 is a diagram of an example of the electronic apparatus including the display device with a touch detection function according to the embodiment.

The electronic apparatus illustrated in FIG. 33 is a notebook personal computer to which the display device with a touch detection function 1 is applied. Examples of the notebook personal computer include, but are not limited to, a main body 541, a keyboard 542 for performing an input operation of text and the like, and a display unit 543 that displays an image. The display device with a touch detection function 1 is applied to the display unit 543. Therefore, the display unit 543 of the notebook personal computer has the function of detecting a touch operation in addition to the function of displaying an image.

Application Example 5

The electronic apparatus illustrated in FIG. 34 to FIG. 40 is a mobile phone to which the display device with a touch detection function 1 is applied. The mobile phone is configured to couple, for example, an upper housing 551 and a lower housing 552 with a coupling portion (hinge portion) 553, and include a display 554, a sub-display 555, a picture light 556, and a camera 557. The display device with a touch detection function 1 is installed into the display 554. Therefore, the display 554 of the mobile phone has the function of detecting a touch operation in addition to the function of displaying an image.

4. Aspects of Present Disclosure

The present disclosure includes aspects as follows.

(1) A display device with a touch detection function comprising:
a plurality of drive elements that perform a display operation based on a pixel signal and a display drive signal;
a touch detection electrode that detects proximity or contact of an object based on an excitation signal;
a drive electrode to which the excitation signal fluctuated at least in level at a predetermined cycle is applied in order to detect the proximity or the contact of the object;
a first substrate on which the drive elements are provided;
a second substrate on which at least one of the touch detection electrode and the drive electrode is provided, the second substrate being bonded to the first substrate to face each other via a sealing member;
a conductor that electrically is coupled to at least one of the touch detection electrode and the drive electrode; and
a conductor support member that fills a space between the first substrate and the second substrate at a position of at least one edge face of the second substrate or in a manner protruding in a direction farther away from the sealing member than the position of the edge face, and on the surface of which the conductor is provided.

(2) The display device with a touch detection function according to (1), wherein the conductor support member is a resin layer configured to
cover at least a portion from the edge face to a part of a surface of the first substrate, and
become smaller in size in a direction perpendicular to the surface of the first substrate with the separation thereof from the edge face.

(3) The display device with a touch detection function according to (1), wherein the conductor support member is the sealing member that is provided up to a position of the edge face or up to a position away from the edge face.

(4) The display device with a touch detection function according to (3), wherein the edge face is configured to become smaller in size in a direction perpendicular to a surface of the second substrate with extension thereof toward the outside of the second substrate.

(5) The display device with a touch detection function according to (1), wherein the conductor is conductive paste.

(6) The display device with a touch detection function according to (1), wherein the conductor support member includes
a portion where the conductor is provided and has hydrophilic property, and
a portion where no conductor is provided and has water-repellent property.

(7) The display device with a touch detection function according to (1), wherein the conductor is provided around a position of an electronic component mounted on the first substrate.

(8) The display device with a touch detection function according to (7), wherein the conductor is provided in plurality and includes one provided on one side of the electronic component and another provided on another side thereof.

(9) A display device with a touch detection function comprising:
a plurality of drive elements that perform a display operation based on a pixel signal and a display drive signal;
a touch detection electrode that detects proximity or contact of an object based on an excitation signal;
a first substrate on which the drive elements are provided;
a second substrate on which the touch detection electrode is provided, the second substrate being bonded to the first substrate to face each other via a sealing member; and
a wiring member that includes
a conductor for electrically coupling at least the touch detection electrode and an electrode provided on a surface of the first substrate and
a base material for supporting the conductor,
and that is provided between the second substrate and the first substrate.

(10) The display device with a touch detection function according to (9), wherein the wiring member is provided around a position of an electronic component mounted on the first substrate.

(11) An electronic apparatus comprising:
a display device with a touch detection function according to (1).

(12) A method of manufacturing a display device with a touch detection function, the method comprising:
bonding a first substrate on which a plurality of drive elements are formed and a second substrate on which a touch detection electrode is formed using a sealing member;
injecting liquid crystal into between the first substrate and the second substrate and sealing an injection hole;
providing a resin layer at least on an edge face where the touch detection electrode of the second substrate is pulled out and a portion of a surface of the first substrate; and
providing a conductor electrically coupling to the touch detection electrode on a surface of the resin layer.

(13) A method of manufacturing a display device with a touch detection function, the method comprising:
bonding a first substrate on which a plurality of drive elements are formed and a second substrate on which a touch detection electrode is formed via sealing member that is protruded at least from an edge face where the touch detection electrode of the second substrate is pulled out;

injecting liquid crystal into between the first substrate and the second substrate and sealing an injection hole; and providing a conductor for electrically coupling the touch detection electrode of the second substrate and an electrode provided on a surface of the first substrate.

(14) The method of manufacturing a display device with a touch detection function according to (13), the method further comprising:

processing at least the edge face where the touch detection electrode of the second substrate is pulled out so that a size of the edge face in a direction perpendicular to a surface of the second substrate becomes smaller with extension of the edge face toward the outside of the second substrate.

The display device with a touch detection function and the electronic apparatus with the same according to the present disclosure includes the conductor support member that fills a space between the first substrate and the second substrate and has the conductor as wiring provided on its surface. Because the conductor support member fills the space between the first substrate and the second substrate, even if the conductor such as conductive paste is provided on the surface of the conductor support member, entering of the conductor into the space and spread thereof can be prevented. As a result, the present disclosure is capable of surely exerting the function of the wiring for electrically coupling both of the substrates, outside the substrates.

The display device with a touch detection function and the electronic apparatus with the same according to the present disclosure use the wiring member that includes the conductor for electrically coupling the touch detection electrode and the electrode provided on the surface of the first substrate and the base material for supporting the conductor, and arrange the conductor which is separated from the space between the first substrate and the second substrate. As a result, the present disclosure is capable of surely exerting the function of the wiring for electrically coupling both of the substrates, outside the substrates.

The method of manufacturing a display device with a touch detection function according to the present disclosure is capable of manufacturing the display device with a touch detection function according to the present disclosure.

According to one aspect of the present disclosure, the function of the wiring for electrically coupling between the both of the substrates can be surely exerted at the outer side thereof.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display device with a touch detection function comprising:

a plurality of thin film transistors that perform a display operation based on a pixel signal and a display drive signal;

a plurality of touch electrodes that detect proximity or contact of an object based on an excitation signal;

a first layer on which the thin film transistors are provided;

a second layer on which the touch electrodes are provided;

a first electrode that is disposed on the first layer and that is electrically connected to at least one of the touch electrodes;

a plurality of conductors that electrically connect the first electrode to the touch electrodes;

a conductor support member that is made of an electrically insulating resin and that is provided underneath the conductors; and a plurality of non-conductive segments each arranged between two adjacent conductors of the conductors, wherein the conductor support member inclines from the first layer to the second layer, and the conductors and the non-conductive segments adhere to the conductor support member.

2. The display device with a touch detection function according to claim 1, wherein the conductor support member is a resin layer configured to:

cover at least a portion from an edge face of the second layer to a part of a surface of the first layer; and become smaller in size in a direction perpendicular to the surface of the first layer with the separation thereof from the edge face.

3. The display device with a touch detection function according to claim 1, wherein the conductors are conductive paste.

4. The display device with a touch detection function according to claim 1, wherein the conductor support member includes:

a portion where the conductors are provided and has hydrophilic property; and a portion where no conductor is provided and has water-repellent property.

5. The display device with a touch detection function according to claim 1, wherein the conductors are provided around a position of an electronic component mounted on the first layer.

6. The display device with a touch detection function according to claim 5, wherein the conductors include a first conductor provided on one side of the electronic component and a second conductor provided on another side of the electronic component.

* * * * *